(12) United States Patent
Chu et al.

(10) Patent No.: US 10,297,698 B2
(45) Date of Patent: May 21, 2019

(54) ARTICLES, COATING COMPOSITIONS, AND METHODS

(71) Applicant: 3M INNOVATIVE PROPERTIES COMPANY, Saint Paul, MN (US)

(72) Inventors: Yiwen Chu, Shanghai (CN); Zhigang Yu, Shanghai (CN); Naiyong Jing, Woodbury, MN (US); Rui Pan, Hangzhou (CN)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 15/933,412

(22) Filed: Mar. 23, 2018

(65) Prior Publication Data

US 2018/0212076 A1 Jul. 26, 2018

Related U.S. Application Data

(62) Division of application No. 13/695,674, filed as application No. PCT/US2011/033723 on Apr. 25, 2011, now abandoned.

(30) Foreign Application Priority Data

May 11, 2010 (CN) .......................... 2010 1 0170156

(51) Int. Cl.
| | |
|---|---|
| C08K 3/36 | (2006.01) |
| C08K 9/06 | (2006.01) |
| C09D 1/00 | (2006.01) |
| C09D 7/40 | (2018.01) |
| C03C 17/00 | (2006.01) |
| H01L 31/0216 | (2014.01) |

(52) U.S. Cl.
CPC ...... H01L 31/02168 (2013.01); C03C 17/007 (2013.01); C09D 1/00 (2013.01); C09D 7/67 (2018.01); C09D 7/70 (2018.01); C03C 2217/425 (2013.01); C03C 2217/465 (2013.01); C03C 2217/478 (2013.01); C08K 3/36 (2013.01); C08K 9/06 (2013.01); Y02E 10/50 (2013.01); Y10T 428/315 (2015.01); Y10T 428/31525 (2015.04); Y10T 428/31645 (2015.04); Y10T 428/31667 (2015.04)

(58) Field of Classification Search
CPC ....... H01L 31/02168; C09D 7/67; C09D 7/70; C09D 1/00; C03C 17/007
See application file for complete search history.

(56) References Cited

U.S. PATENT DOCUMENTS

| | | | |
|---|---|---|---|
| 2,366,516 A | 1/1945 | Geffcken et al. | |
| 2,432,484 A | 12/1947 | Moulton | |
| 2,536,764 A | 1/1951 | Moulton | |
| 2,601,123 A | 6/1952 | Moulton | |
| 2,801,185 A | 7/1957 | Iler | 106/490 |
| 2,803,552 A | 8/1957 | Stedman | |
| 3,075,228 A | 1/1963 | Elias | |
| 3,337,351 A | 8/1967 | Morehouse | |
| 3,507,897 A | 4/1970 | Kanner | |
| 3,819,522 A | 6/1974 | Zmoda et al. | |
| 3,976,497 A | 8/1976 | Clark | |
| 4,152,165 A | 5/1979 | Langager | |
| 4,275,118 A | 6/1981 | Baney et al. | |
| 4,338,377 A | 7/1982 | Beck | |
| 4,467,073 A | 8/1984 | Creasy | |
| 4,478,909 A | 10/1984 | Taniguchi | |
| 4,504,109 A | 3/1985 | Taga | |
| 4,507,547 A | 3/1985 | Taga | |
| 4,522,958 A | 6/1985 | Das et al. | |
| 4,816,333 A | 3/1989 | Lange et al. | |
| 4,876,039 A | 10/1989 | Lo | |
| 4,944,294 A | 7/1990 | Borek, Jr. | |
| 5,126,394 A | 6/1992 | Revis | |
| 5,204,219 A | 4/1993 | Van Ooij | |
| 5,221,497 A | 6/1993 | Watanabe et al. | |
| 5,286,782 A | 2/1994 | Lamb et al. | |
| 5,354,797 A | 10/1994 | Anderson et al. | |

(Continued)

FOREIGN PATENT DOCUMENTS

| | | |
|---|---|---|
| CN | 1884409 | 12/2006 |
| CN | 101579672 | 5/2008 |

(Continued)

OTHER PUBLICATIONS

PCT International Search Report for PCT/US2011/033723, dated Jan. 9, 2012, 4 pages.

(Continued)

Primary Examiner — Melvin C. Mayes
Assistant Examiner — Michael Forrest
(74) Attorney, Agent, or Firm — Carlos M. Tellez

(57) ABSTRACT

There is provided a coating composition comprising non-spherical nanoparticles; spherical nanoparticles; optionally hydrophilic groups and optional an surfactant; and a liquid medium comprising water and no greater than 30 wt % organic solvent, if present, based on the total weight of liquid medium, where at least a portion of the nonspherical nanoparticles or at least a portion of the spherical nanoparticles comprises functional groups attached to their surface through chemical bonds, wherein the functional groups comprise at least one group selected from the group consisting of epoxy group, amine group, hydroxyl, olefin, alkyne, (meth) acrylato, mercapto group, or combinations thereof. There is also provided a method for modifying a substrate surface using the coating composition and articles made therefrom.

15 Claims, No Drawings

(56) References Cited

U.S. PATENT DOCUMENTS

| | | | |
|---|---|---|---|
| 5,464,900 A | 11/1995 | Stofko et al. | |
| 5,585,186 A | 12/1996 | Scholz et al. | |
| 5,597,512 A | 1/1997 | Watanabe et al. | |
| 5,637,368 A | 6/1997 | Cadalbert | |
| 5,639,546 A | 6/1997 | Bikadi | |
| 5,709,930 A | 1/1998 | DePauw | |
| 5,723,175 A | 3/1998 | Scholz et al. | |
| 5,753,373 A | 5/1998 | Scholz et al. | |
| 5,756,226 A | 5/1998 | Valentini et al. | |
| 5,820,978 A | 10/1998 | Huang | |
| 5,873,931 A | 2/1999 | Scholz | |
| 5,922,299 A | 7/1999 | Bruinsma et al. | |
| 5,989,515 A | 11/1999 | Watanabe et al. | |
| 5,997,621 A | 12/1999 | Scholz et al. | |
| 6,013,724 A | 1/2000 | Mizutani et al. | |
| 6,040,053 A | 3/2000 | Scholz et al. | |
| 6,040,378 A | 3/2000 | Sanduja et al. | |
| 6,096,469 A | 8/2000 | Anderson et al. | |
| 6,165,256 A | 12/2000 | Hayakawa et al. | |
| 6,251,523 B1 | 6/2001 | Takahashi et al. | |
| 6,258,969 B1 | 7/2001 | Sawai et al. | |
| 6,291,535 B1 | 9/2001 | Watanabe et al. | |
| 6,352,780 B1 | 3/2002 | Sanduja et al. | |
| 6,395,149 B1 | 5/2002 | Palmgren | |
| 6,428,898 B1 | 8/2002 | Barsotti et al. | |
| 6,467,897 B1 | 10/2002 | Wu | |
| 6,544,593 B1 | 4/2003 | Nagata et al. | |
| 6,599,976 B2 | 7/2003 | Kobayashi et al. | |
| 6,605,683 B1 | 8/2003 | Zhang | |
| 6,727,309 B1 | 4/2004 | Paiva | |
| 6,767,984 B2 | 7/2004 | Toui | |
| 6,797,391 B2 | 9/2004 | Shibato et al. | |
| 6,838,178 B1 | 1/2005 | Strickler et al. | |
| 6,858,306 B1 | 2/2005 | Strickler et al. | |
| 6,918,957 B2 | 7/2005 | Kursawe et al. | |
| 6,921,578 B2 | 7/2005 | Tsujino | |
| 7,022,416 B2 | 4/2006 | Teranishi | |
| 7,066,998 B2 | 6/2006 | Rohrbaugh et al. | |
| 7,074,463 B2 | 7/2006 | Jones | |
| 7,179,513 B2 | 2/2007 | Jones | |
| 7,264,872 B2 | 9/2007 | Walker, Jr. | |
| 7,282,272 B2 | 10/2007 | Jones | |
| 7,297,810 B2 | 11/2007 | Walker, Jr. | |
| 7,309,517 B2 | 12/2007 | Jones | |
| 7,326,448 B2 | 2/2008 | Jones | |
| 7,348,054 B2 | 3/2008 | Jacquiod | |
| 7,369,122 B2 | 5/2008 | Cross | |
| 7,547,476 B2 | 6/2009 | Jones | |
| 7,973,096 B2 | 7/2011 | Anderson | |
| 2001/0051213 A1 | 12/2001 | Schulz et al. | |
| 2002/0090519 A1 | 7/2002 | Kursawe | |
| 2004/0068035 A1 | 4/2004 | Paiva et al. | |
| 2004/0219348 A1 | 11/2004 | Jacquiod | |
| 2004/0237833 A1 | 12/2004 | Sepeur | |
| 2005/0095420 A1 | 5/2005 | Berni | |
| 2005/0233135 A1 | 10/2005 | Iyer et al. | |
| 2005/0266248 A1 | 12/2005 | Millero | |
| 2006/0062923 A1 | 3/2006 | Dilley et al. | |
| 2006/0093786 A1 | 5/2006 | Ohashi et al. | |
| 2006/0204655 A1 | 9/2006 | Takahashi et al. | |
| 2006/0204676 A1 | 9/2006 | Jones | |
| 2006/0204679 A1 | 9/2006 | Jones | |
| 2006/0269724 A1 | 11/2006 | Ohashi et al. | |
| 2007/0051274 A1 | 3/2007 | Saito et al. | |
| 2007/0104922 A1 | 5/2007 | Zhai et al. | |
| 2007/0275042 A1 | 11/2007 | Anderson | |
| 2007/0292679 A1 | 12/2007 | Pellerite | |
| 2008/0032053 A1 | 2/2008 | Kourtakis et al. | |
| 2008/0057187 A1 | 3/2008 | Trapp et al. | |
| 2008/0070030 A1 | 3/2008 | Baran | |
| 2008/0124539 A1 | 5/2008 | Kawai et al. | |
| 2008/0138538 A1 | 6/2008 | Lewis | |
| 2009/0025727 A1 | 1/2009 | Klun et al. | |
| 2009/0289225 A1 | 11/2009 | Jing | |
| 2010/0035039 A1 | 2/2010 | Jing et al. | 428/304.4 |
| 2010/0092763 A1 | 4/2010 | Kleiman et al. | |
| 2010/0101649 A1 | 4/2010 | Huignard et al. | |
| 2010/0104858 A1 | 4/2010 | Horio | |
| 2010/0209946 A1 | 8/2010 | Jing | |
| 2011/0033694 A1 | 2/2011 | Jing | |

FOREIGN PATENT DOCUMENTS

| | | |
|---|---|---|
| DE | 10239762 | 3/2004 |
| EP | 0 145 308 | 6/1985 |
| EP | 0 263 428 | 4/1988 |
| EP | 0 424 006 | 4/1991 |
| EP | 0 570 165 | 11/1993 |
| EP | 0 372 756 | 12/1996 |
| EP | 1 132 448 | 9/2001 |
| GB | 1 454 960 | 11/1976 |
| GB | 2 041 956 | 9/1980 |
| GB | 2 137 648 | 10/1984 |
| JP | 59015473 | 1/1984 |
| JP | 1985044147 | 10/1985 |
| JP | 1985044148 | 10/1985 |
| JP | 1985044149 | 10/1985 |
| JP | 05163463 | 6/1993 |
| JP | 2004083846 | 3/2004 |
| JP | 2005-010470 | 1/2005 |
| JP | 2007070395 | 3/2007 |
| JP | 2007320145 | 12/2007 |
| JP | 2007332262 | 12/2007 |
| JP | 2009-098658 | 5/2009 |
| KR | 10-2007-0089979 | 9/2007 |
| WO | WO 1996/018691 | 6/1996 |
| WO | WO 2000/00855 | 1/2000 |
| WO | WO 2004/073972 | 2/2004 |
| WO | WO 2005/067753 | 7/2005 |
| WO | WO 2006/054888 | 5/2006 |
| WO | WO 2006/099906 | 9/2006 |
| WO | WO 2007/017504 | 2/2007 |
| WO | WO 2008/103593 | 8/2008 |
| WO | WO 2008/131063 | 10/2008 |
| WO | WO 2009/085680 | 7/2009 |
| WO | WO 2009/086079 | 7/2009 |
| WO | WO 2009085680 A1 | 7/2009 |
| WO | WO 2009/140482 | 11/2009 |
| WO | WO 2010-017069 | 2/2010 |
| WO | WO 2011/002838 | 1/2011 |

OTHER PUBLICATIONS

Bragg, et al., "The Form Birefringence of Macromolecules," Acta Crystallographica, vol. 6, p. 865-867, (1953).

Masso, "Evaluation of Scratch Resistant and Anti-reflective Coatings for Plastic Lenses," Annual Technical Conference Proceedings—Society of Vacuum Coaters, (1989), $32^{nd}$, pp. 237-240.

Iler, "The Chemistry of Silica—Solubility, Polymerization, Colloid and Surface Properties, and Biochemistry," John Wiley & Sons, p. 665, 1979.

ASTM Test Method D1003-92, entitled, "Standard Test Method for Haze and Luminous Transmittance of Transparent Plastics," pp. 220-224.

Shang et al., "Optically transparent superhydrophobic silica-based films," Thin Solid Films, vol. 427, pp. 37-43, Jan. 24, 2005.

Nissan Chemical SNOWTEX® product literature download from http://www.nissanchem-usa.com/snowtex.php on Jul. 1, 2010.

Ion Exchange Chemistry and Operation downloaded from http://www.remco.com/ix.htm on Jul. 1, 2010, pp. 1-9.

Zhang, Zuyi, "Catalytic Effect of Aluminum Acetylacetonate on Hydrolysis and Polymerization of Methyltrimethoxysilane," Langmuir, vol. 13, pp. 473-476, 1997.

Plueddemann, Edwin, "Silane Coupling Agents," Pleunum Press: New York, p. 20, 1982.

Snowtex product literature, 2007, downloaded from http://www.nissanchem-usa.com/snowtex.php.

Abe, "Anti-Reflective Coatings for CRTs by Sol-Gel Process", Journal of Sol-Gel Science and Technology, 2001, vol. 22, Nos. 1-2, pp. 151-166.

(56) References Cited

OTHER PUBLICATIONS

Bravo, "Transparent Superhydrophobic Films Based on Silica Nanoparticles", Langmuir, Jun. 19, 2007, vol. 23, No. 13, pp. 7293-7298.

Cebeci, "Nanoporosity-Driven Superhydrophilicity: A Means to Create Multifunctional Antifogging Coatings", Langmuir, 2006, vol. 22, No. 6, pp. 2856-2862.

Cho, "Colloidal Indium Tin Oxide Nanoparticles for Transparent and Conductive Films", Thin Solid Films, Dec. 2006, vol. 515, Nos. 4-5, pp. 1864-1871.

Greene, "Protective Groups in Organic Synthesis", $2^{nd}$ Edition, John Wiley & Sons, Inc., New York, (1991).

Haas, "Functionalized coatings based on inorganic-organic polymers (ORMOCER® s) and their combination with vapor deposited inorganic thin films", Surface and Coatings Technology, Jan. 1999, vol. 111, No. 1, pp. 72-79.

Haas, "Functionalized coating materials based on inorganic-organic polymers", Thin Solid Films, Aug. 1999, vol. 351, Nos. 1-2, pp. 198-203.

Hattori, "Anti-Reflection Surface with Particle Coating Deposited by Electrostatic Attraction", Advanced Materials, Jan. 2001, vol. 13, No. 1, pp. 51-54.

Irie, "Visible-light induced hydrophilicity on nitrogen-substituted titanium dioxide films", Chemical Communications, 2003, vol. 11, pp. 1298-1299.

Kang, "Material and rheological properties of (glycidoxypropyl) trimethoxysilane modified colloidal silica coatings", Korea-Australia Rheology Journal, Dec. 2004, vol. 16, No. 4, pp. 175-182.

Kim, "Two-layer hybrid anti-reflection film prepared on the plastic substrates", Current Applied Physics, Apr. 2002, vol. 2, No. 2, pp. 123-127.

Kocienski, "Protecting Groups", $3^{rd}$ Edition, Georg Thieme Verlag, Stuttgart, (2004).

Lee, "pH-Dependent Structure and Properties of $TiO_2/SiO_2$ Nanoparticle Multilayer Thin Films", Chemical Materials, Mar. 20, 2007, vol. 19, No. 6, pp. 1427-1433.

Liu, "Reversible Wettability of a Chemical Vapor Deposition Prepared ZnO Film between Superhydrophobicity and Superhydrophilicity", Langmuir, Jul. 6, 2004, vol. 20, No. 14, pp. 5659-5661.

Ma, "Polystyrene Nanocomposite Materials: Preparation, Morphology, and Mechanical, Electrical, and Thermal Properties", Journal of Applied Polymer Science, Dec. 2005, vol. 98, No. 5, pp. 2266-2273.

McHale, "Topography Driven Spreading", Physical Review Letters, Jul. 2004, vol. 93, No. 3, pp. 036102-1-036102-4.

Meincken, "Determination of the hydrophilic character of membranes by pulsed force mode atomic force microscopy", Applied Surface Science, Dec. 2005, vol. 252, No. 5, pp. 1772-1779.

Ming, "Superhydrophobic Films from Raspberry-like Particles", Nano Letters, 2005, vol. 5, No. 11, pp. 2298-2301.

Nuraje, "Durable Antifog Films from Layer-by-Layer Molecularly Blended Hydrophilic Polysaccharides", Langmuir, 2011, vol. 27, No. 2, pp. 782-791.

Ohishi, "Preparation and Properties of Anti-reflection/Anti-static Thin Films for Cathode Ray Tubes Prepared by Sol-Gel Method Using Photoirradiation", Journal of Sol-Gel Science and Technology, 1997, vol. 8, Nos. 1-3, pp. 511-515.

Ohishi, "Preparation and properties of anti-reflection/anti-static thin films formed on organic film by photo-assisted sol-gel method", Journal of Non-Crystalline Solids, Dec. 2003, vol. 332, Nos. 1-3, pp. 87-92.

Okubo, "New Coating Materials Prepared by Radiation-induced Polymerization. I. Mar-resistant Coating Composition and Properties", Journal of Applied Polymer Science, Feb. 1978, vol. 22, No. 2, pp. 487-496.

Pal'Tsyn, "The Role of Agglutination in Bacterial Infection", Bulletin of Experimental Biology and Medicine, Jan. 1999, vol. 127, No. 1, pp. 1-4.

Shirtcliffe, "Porous materials show superhydrophobic to superhydrophilic switching", Chemical Communications, 2005, vol. 25, pp. 3135-3137.

Sittinger, "Production of MF and DC-pulse sputtered anti-reflective/anti-static optical interference coatings using a large area in-line coater", Thin Solid Films, Apr. 2006, vol. 502, Nos. 1-2, pp. 175-180.

Song, "Synthesis of Hydrophilic Coating Solution for Polymer Substrate Using Glycidoxypropyltrimethoxysilane", Journal of Sol-Gel Science and Technology, 2003, vol. 27, pp. 53-59.

Sun, "Reversible Switching between Superhydrophilicity and Superhydrophobicity", Angewandte Chemie International Edition, Jan. 2004, vol. 43, No. 3, pp. 357-360.

Wang, "Light-Induced Amphiphilic Surfaces", Nature, Jul. 31, 1997, vol. 388, No. 6641, pp. 431-432.

Wouters, "Transparent UV curable antistatic hybrid coatings on polycarbonate prepared by the sol-gel method", Progress in Organic Coatings, Dec. 2004, vol. 51, No. 4, pp. 312-320.

Wu, "Structural Color in Porous, Superhydrophilic, and Self-cleaning $SiO_2/TiO_2$ Bragg Stacks", Small, Aug. 3, 2007, vol. 3, No. 8, pp. 1445-1451.

Yoon, "Specific Targeting, Cell Sorting, and Bioimaging with Smart Magnetic Silica Core-Shell Nanomaterials", Small, Feb. 2006, vol. 2, No. 2, pp. 209-215.

Yu, "Preparation and characterization of super-hydrophilic porous $TiO_2$ coating films", Materials Chemistry and Physics, Feb. 2001, vol. 68, Nos. 1-3, pp. 253-259.

Extended European Search Report for PCT/US2011/033733 (EP11781000) dated Jun. 13, 2014.

Laane et al. ("Photosensitized electron transfer processes in SiO2 colloids and sodium lauryl sulfate micellar systems: Correlation of quantum yields with interfacial surface potentials," Proceedings of the National Academy of Science 78(10), pp. 5928-5932, Oct. 1981).

Brinker ("Hydrolysis and Condensation of Silicates: Effects on Structure," Journal of Non-Crystalline Solids 100(1-3), pp. 31-50, Mar. 1988).

ARTICLES, COATING COMPOSITIONS, AND METHODS

CROSS REFERENCE TO RELATED APPLICATIONS

This application is a Divisional of U.S. application Ser. No. 13/695,674, filed Nov. 1, 2012, now abandoned, which is a national stage filing under 35 U.S.C. 371 of PCT/US2011/33723, filed Apr. 25, 2011, which claims priority to Chinese Application No. 201010170156.6, filed May 11, 2010. The disclosures of all three applications are incorporated by reference in their entirety herein.

FIELD OF THE INVENTION

The present application relates to a coating composition, a method of modifying a substrate surface and articles coated with the coating composition.

BACKGROUND

Articles having surfaces with antireflective, easy cleaning and improved durability characteristics are desirable for a variety of uses. For example, photoelectric conversion ratio of the solar glass for a solar battery can be improved by a glass coating.

Some glass coating compositions have been developed. For example, U.S. Pat. Nos. 6,040,378 and 6,352,780 disclosed a polymeric coating composition for application onto glass substrates for anti-reflective properties. The coating is provided via chemical grafting that involves the use of monomers and/or prepolymers, catalyst and graft initiator and when applied onto the surface of the glass substrate forms a polymeric film chemically bonded to the glass with excellent adhesion. This coating can reduce the reflectance of the coated glass surface as close to zero as possible, thus maximizing transmittance and providing resistance to abrasion, water/chemical attack and UV degradation. U.S. Pat. No. 6,838,178 disclosed a color neutral absorbing film that is applied as a coating on a glass substrate, to which a conductive coating is first applied. An additional metal oxide layer is deposited on the absorbing film. The coating is suitable for use in anti-reflective coatings containing other metal oxides to achieve a coated glass article having a visible light transmittance of 30% or greater and a reflectance of less than 5%. The coated glass article is absorbing, anti-reflective and conducting. U.S. Pat. No. 6,858,306 disclosed a coated article including a glass substrate, a coating of antimony doped tin oxide deposited on and adhering to the glass substrate and a coating of fluorine doped tin oxide. The low emittance of the coated glass article, when combined with the surprisingly selective solar absorption of the multilayer stack provides improved heat rejection in summer and heat retention in winter, while permitting the transmittance of a relatively high degree of visible light.

However, a need still exists for a coating composition that will impart at least one of antireflective, easy cleaning and improved durability to a substrate coated therewith.

SUMMARY

The invention relates to a liquid coating composition that imparts at least one of the following characteristics antireflective, easy cleaning and improved durability to substrates coated therewith, as well as methods of coating and coated articles. In some embodiments, the liquid is an aqueous-based liquid. The coating compositions utilize nonspherical and spherical nanoparticles, wherein a least a portion of nonspherical nanoparticles or at least a portion of spherical nanoparticles are functionalized with at least one group selected from the group consisting of epoxy group, amine group, hydroxyl, olefin, alkyne, (meth) acrylato, mercapto or combinations thereof attached to their surfaces through chemical bonds. In some embodiments, the nanoparticles are silica nanoparticles. In some embodiments, all of the non-spherical nanoparticles are functionalized with at least one group selected from the group consisting of epoxy group, amine group, hydroxyl, olefin, alkyne, (meth) acrylato, mercapto or combinations thereof attached to their surfaces through chemical bonds. In some embodiments all of the spherical nanoparticles are functionalized with at least one group selected from the group consisting of epoxy group, amine group, hydroxyl, olefin, alkyne, (meth) acrylato, mercapto or combinations thereof attached to their surfaces through chemical bonds. The coating compositions are particularly useful on solar panels, outdoor signages, automobile bodies for easy cleaning and on a wide variety of personal protection equipment such as face masks, shields, and protective glasses.

In one embodiment, the present invention provides a method of modifying a substrate surface. The method includes: applying a coating composition to a substrate; and drying the coating composition to form a coating on the substrate; wherein the coated substrate demonstrates improvement, relative to the uncoated substrate, in at least one characteristic selected from the group consisting of antireflective, dust or dirt repellent, easy cleaning and improved durability. The coating composition includes: nonspherical nanoparticles; spherical nanoparticles; optional hydrophilic groups and an optional surfactant; and a liquid medium comprising water and no greater than 30 wt % organic solvent, if present, based on the total weight of liquid medium, wherein a least a portion of nonspherical nanoparticles or at least a portion of spherical nanoparticles comprises functional groups attached to their surfaces through chemical bonds, wherein the functional groups comprise at least one group selected from the group consisting of epoxy group, amine group, hydroxyl, olefin, alkyne, (meth)acrylato, mercapto, or combinations thereof. In some embodiments, all of the nonspherical nanoparticles comprises functional groups attached to their surfaces through chemical bonds, wherein the functional groups comprise at least one group selected from the group consisting of epoxy group, amine group, hydroxyl, olefin, alkyne, (meth)acrylato, mercapto, or combinations thereof. In some embodiments, all of the spherical nanoparticles comprises functional groups attached to their surfaces through chemical bonds, wherein the functional groups comprise at least one group selected from the group consisting of epoxy group, amine group, hydroxyl, olefin, alkyne, (meth)acrylato, mercapto, or combinations thereof.

In one embodiment, the present invention provides a coating composition. The coating composition includes: nonspherical nanoparticles; spherical nanoparticles; optional hydrophilic groups and an optional surfactant; and a liquid medium comprising water and no greater than 30 wt % organic solvent, if present, based on the total weight of liquid medium, wherein a least a portion of nonspherical nanoparticles or at least a portion of spherical nanoparticles comprises functional groups attached to their surface through chemical bonds, wherein the functional groups comprise at least one group selected from the group consisting of epoxy group, amine group, hydroxyl, olefin, alkyne, (meth)acrylato, mercapto, or combinations thereof. In some embodiments, all of the nonspherical nanoparticles comprises functional groups attached to their surfaces through chemical bonds, wherein the functional groups comprise at least one group selected from the group consisting of epoxy group, amine group, hydroxyl, olefin, alkyne, (meth)acrylato, mercapto, or combinations thereof. In some embodiments, all of the spherical nanoparticles comprises functional groups attached to their surfaces through chemical bonds, wherein the functional groups comprise at least one group selected from the group consisting of epoxy group, amine group, hydroxyl, olefin, alkyne, (meth)acrylato, mercapto, or combinations thereof. The coating composition provides a coating to a substrate on which it is coated and dried, having an improvement, relative to an uncoated substrate, in at least one characteristic selected from the group consisting of antireflective, easy cleaning and improved durability.

In one embodiment, the present coating compositions may optionally contain a curing agent or a co-curing agent including a radical initiator, aliphatic amine, or polyamine or epoxy or multifunctional epoxy monomer/oligomers or combinations thereof.

In one embodiment, the present invention provides an article comprising a substrate surface modified using the method of the present invention. In certain embodiments, the article is a personal protection article, an automotive vehicle or an outdoor signage. In certain embodiments, the article is a solar panel. In certain embodiments, the substrate is glass or ceramic.

In one embodiment, the present invention provides an article comprising a substrate surface modified using the coating composition of the present invention.

In some embodiments, the spherical nanoparticles have an average particle size ranging from 1 nm to 120 nm.

Definitions

"Nanoparticles" are herein defined as nanometer-sized particles, having, for example, an average particle size of no greater than 200 nanometers (nm). The terms "particle size" and "particle diameter" as used herein have the same meaning and are used to refer to the largest dimension of a particle, or agglomerates or agglomerations thereof. In this context, "agglomeration" refers to a weak association between particles that may be held together by charge or polarity and can be broken down into smaller entities.

The term "spherical" as used herein means a three dimensional shape, all points of which are equidistance from a fixed point.

The term "nonspherical" as used herein means all 3 dimensional shapes other than spherical ones, including but not limited to particles having needle-like elongated shapes, sting-like elongated shapes, rod-like elongated shapes, chain-like elongated shapes, filamentary elongated shapes, and the like.

"Hydrophilic groups" include water-dispersible groups, water-soluble groups, and/or charged groups that provide hydrophilicity to the surface of the nanoparticles. Preferably, if such groups are attached to nanoparticles, they are capable of reducing, and preferably preventing, excessive agglomeration and precipitation of nanoparticles in water, and are referred to as "water-dispersible groups."

"Charged groups" refer to groups that have one or more than one ionizable group per functional group.

"Tempered glass" means glass that has been subjected to a toughening process that includes heating at an elevated temperature, for example a temperature equal to at least 500° C., at least 600° C., or at least 700° C., for a time up to 30 minutes, up to 20 minutes, up to 10 minutes, or up to 5 minutes and then cooling rapidly. For example, the glass can be heated at a temperature in the range of 700° C. to 750° C. for about 2 to 5 minutes followed by rapid cooling.

A "dried" coating is a coating that has been applied from a coating composition that includes a liquid carrier (i.e., fluid or liquid media), and the liquid carrier has been substantially completely removed, for example, by evaporation. A dried coating is typically also "cured" as a result of reaction between the reactive functional groups (e.g., amine groups and epoxy groups) during the solvent evaporation. The rate and degree of curing can be enhanced by heating the coating composition during the drying process.

The terms "comprises" and variations thereof do not have a limiting meaning where these terms appear in the description and claims.

The terms "preferred" and "preferably" refer to embodiments of the invention that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the invention.

As used herein, "a," "an," "the," "at least one," and "one or more" are used interchangeably. Thus, for example, a nanoparticle that comprises "a" functional group can be interpreted to mean that the nanoparticle includes "one or more" functional groups.

The term "and/or" means one or all of the listed elements/characteristics or a combination of any two or more of the listed elements/characteristics.

As used herein, the term "or" is generally employed in its usual sense including "and/or" unless the content clearly dictates otherwise.

Also herein, the recitations of numerical ranges by endpoints include all numbers subsumed within that range (e.g., 1 to 5 includes 1, 1.5, 2, 2.75, 3, 3.80, 4, 5, etc.).

The above summary of the present invention is not intended to describe each disclosed embodiment or every implementation of the present invention. The description that follows more particularly exemplifies illustrative embodiments. In several places throughout the application, guidance is provided through lists of examples, which examples can be used in various combinations. In each instance, the recited list serves only as a representative group and should not be interpreted as an exclusive list.

DETAILED DESCRIPTION OF ILLUSTRATIVE EMBODIMENTS

The invention relates to aqueous-based coating compositions containing functionalized nonspherical or spherical nanoparticles, particularly silica nanoparticles, as well as methods of coating and coated articles. At least a portion of nonspherical nanoparticles or at least a portion of spherical nanoparticles are functionalized with at least one group selected from the group consisting of epoxy group, amine group, hydroxyl, olefin, alkyne, (meth) acrylato, mercapto, or combinations thereof, and optionally hydrophilic groups (which are water-like functionalities and may be water-dispersible, water-soluble, and/or charged groups).

In certain embodiments, only nonspherical nanoparticles are functionalized. It should be understood that, in these embodiments, although a certain portion of the population of nonspherical nanoparticles can be bare particles upon applying the coating composition to a substrate, a large portion, and preferably a majority, of the nonspherical nanoparticles have functionalities (e.g., epoxy group, amine group, hydroxyl, olefin, alkyne, (meth) acrylato, mercapto, or combinations thereof) covalently bonded thereto.

In certain embodiments, only spherical nanoparticles are functionalized. It should be understood that, in these embodiments, although a certain portion of the population of spherical nanoparticles can be bare particles upon applying the coating composition to a substrate, a large portion, and preferably a majority, of the spherical nanoparticles have functionalities (e.g., epoxy group, amine group, hydroxyl, olefin, alkyne, (meth) acrylato, mercapto, or combinations thereof) covalently bonded thereto.

In certain embodiments, all of the nonspherical nanoparticles or all of the spherical nanoparticles are functionalized. It should be understood that, in other certain embodiments, a certain portion of the population of nonspherical nanoparticles and/or spherical nanoparticles can be bare particles upon applying the coating composition to a substrate.

Coating compositions of the present invention impart at least one of antireflective, easy cleaning and improved durability to substrates coated therewith. One or more of these properties results from the design of nanoparticle surface-chemistries that enable assembling/interconnecting these nanoparticles together through covalently chemical bonds, thereby forming a continuous network structure, which contributes to the formation of coatings with one or more of such desired properties.

Certain coating compositions of the present invention provide "antireflective" properties to substrates coated and dried thereon, which can be defined as follows. When the coating compositions of the invention are applied to substrates to provide antireflection or reduced reflection properties, glare is reduced by increasing the light transmission of the coated substrate. Preferably, a single-sided coated substrate exhibits an increase in transmission of normal incident light of at least 0.5 percentage points such as a glass substrate, at least 3 percentage points, and up to as much as 10 percentage points or more with a double-sided coated substrates, when compared to an uncoated substrate, at 550 mm (e.g., the wavelength at which the human eye displays peak photo-optic response). The percent transmission is dependent upon the angle of incidence and the wavelength of light and is determined, for example, for plastics, using ASTM test method D1003-92, entitled "Haze and Luminous Transmittance of Transparent Plastics." Preferably, single-sided coated glass substrates display an increase in percent transmission of at least 0.5 percent, and more preferably least 3 percent, when compared with an uncoated substrate, using 550 nm light. Preferably, single-sided coated plastic substrates display an increase in percent transmission of at least 2 percent for plastics, more preferably at least 5 percent, and most preferably greater than 8 percent with double sided coated substrates, when compared with an uncoated substrate, using 550 nm light. For double-sided coated substrates the increase in percent transmission is typically twice these values. When the desired usage involves significant "off-axis" (i.e., non-normal) viewing or unwanted reflections, gains in visibility may be greater especially where the reflections approach or exceed in brightness the object in view.

Antireflection properties are considered over an even broader range than 550 nm when considering solar cells. Solar cells have been developed with a variety of semiconductor materials that have unique absorption spectra for converting solar energy into electricity. Each type of semiconductor material will have a characteristic band gap energy which causes it to absorb light most efficiently at certain wavelengths of light, or more precisely, to absorb electromagnetic radiation over a portion of the solar spectrum. Examples of semiconductor materials used to make solar cells and their solar light absorption band-edge wavelengths include, but are not limited to: crystalline silicon single junction (about 400 nm to about 1150 nm), amorphous silicon single junction (about 300 nm to about 720 nm), ribbon silicon (about 350 nm to about 1150 nm), CIGS (Copper Indium Gallium Selenide, about 350 nm to about 1000 nm), CdTe (Cadmium Telluride, about 400 nm to about 895 nm), GaAs multi junction (about 350 nm to about 1750 nm). The shorter wavelength left absorption band edge of these semiconductor materials is typically between 300 nm and 400 nm. One skilled in the art understands that new materials are being developed for more efficient solar cells having their own unique longer wavelength absorption band-edge and the multi-layer reflective film would have a corresponding reflective band-edge.

Certain coating compositions of the present invention provide easy-cleaning or dust repellent properties to substrates coated and dried thereon. Dried coatings are considered "cleanable" or "easily cleaned" or possessing "cleanable" or "easy-cleaning" characteristics if a coated substrate exhibits oil and/or soil resistance. Alternatively and/or additionally, dried coatings are considered easy-cleaning or cleanable if organic contaminates, such as soil, food, machine oils, paints, dust, and/or dirt, may be simply rinsed away by water. Such easy-cleaning or cleanable characteristics typically result because the nanoporous structure of the coatings tends to prevent penetration by oligomeric and polymeric molecules and possibly provides unique triboelectric properties.

Coating compositions of the present invention, when applied to a substrate (e.g., of inorganic or organic material) and dried, are generally durable such that handling during normal use (e.g., touching) does not completely remove the dried coating. Preferred coatings are durable such that the dried coating is not completely removed under more mechanically harsh (e.g., rubbing) conditions, as demonstrated in the Examples Section.

Preferred dried coatings prepared from coating compositions of the present invention can be sufficiently durable that they can provide one or more desirable properties (antireflective, and/or easy-cleaning characteristics) for at least 12 hours, more preferably for at least 24 hours, even more preferably at least 120 hours, and often as long as 200 or more hours under 50° C. and 90% humidity conditions.

In preferred embodiments, a least a portion of nonspherical nanoparticles or at least a portion of spherical nanoparticles used in the coating compositions of the present invention are functionalized with epoxy group, amine group, hydroxyl, olefin, alkyne, (meth) acrylato, mercapto, or combinations thereof. Herein, "amine" does not include quaternary ammonium. Preferably, the amine groups are primary or secondary (i.e., nontertiary), and more preferably, they are primary amines. They may be aliphatic or aromatic. Optionally, the present coating compositions may contain a curing agent or a co-curing agent including a radical initiator, aliphatic amine, or polyamine or epoxy or multifunctional epoxy monomer/oligomers. These curatives lead to form covalent organic networks among these inorganic nanoparticles, thus improved mechanical durability can be achieved.

Preferred compositions of the present invention can have a relatively long shelf-life, preferably up to several months even when stored in liquid form, or impregnated in an applicator substrate in a sealed container, under ambient conditions (e.g., at Room Temperature).

Nanoparticles

Nanoparticles that are surface modified in accordance with the present invention comprise nanometer-sized particles. The term "nanometer-sized" refers to particles that are characterized by an average particle size (i.e., the average of the largest dimension of the particles, or the average particle diameter for spherical particles) in the nanometer range, often no greater than 200 nanometers (nm), and preferably no greater than 100 nm (prior to surface modification, i.e., functionalization).

Average particle size of the nanoparticles can be measured using transmission electron microscopy. In the practice of the present invention, particle size may be determined using any suitable technique. Preferably, particle size refers to the number average particle size and is measured using an instrument that uses transmission electron microscopy or scanning electron microscopy. Another method to measure particle size is dynamic light scattering that measures weight average particle size. One example of such an instrument found to be suitable is the N4 PLUS SUB-MICRON PARTICLE ANALYZER available from Beckman Coulter Inc. of Fullerton, Calif.

It is also preferable that the nanoparticles be relatively uniform in size. Uniformly sized nanoparticles generally provide more reproducible results. Preferably, variability in the size of the nanoparticles is less than 25% of the mean particle size.

Herein, bare nanoparticles (prior to functionalization) are water-dispersible to reduce, and preferably prevent, excessive agglomeration and precipitation of the particles in an aqueous environment. If necessary, water-dispersibility can be enhanced by functionalizing the nanoparticles with water-dispersible groups. Nanoparticle aggregation can result in undesirable precipitation, gellation, or a dramatic increase in viscosity; however, small amounts of agglomeration can be tolerated when the nanoparticles are in an aqueous environment as long as the average size of the agglomerates (i.e., agglomerated particles) is no greater than 200 nm. Thus, the nanoparticles are preferably referred to herein as colloidal nanoparticles since they can be individual particles or small agglomerates thereof.

The nanoparticles preferably have a surface area of at least 10 $m^2$/gram, more preferably at least 20 $m^2$/gram, and even more preferably at least 25 $m^2$/gram. The nanoparticles preferably have a surface area of greater than 750 $m^2$/gram. Nanoparticles of the present invention can be porous or nonporous.

Suitable glass and ceramic nanoparticles can include, for example, sodium, silicon, aluminum, lead, boron, phosphorous, zirconium, magnesium, calcium, arsenic, gallium, titanium, copper, or combinations thereof. Glasses typically include various types of silicate-containing materials.

The unmodified nanoparticles can be provided as a sol rather than as a powder. Preferred sols generally contain from 15 wt % to 50 wt % of colloidal particles dispersed in a fluid medium. Representative examples of suitable fluid media for the colloidal particles include water, aqueous alcohol solutions, lower aliphatic alcohols, ethylene glycol, N,N-dimethyl acetamide, formamide, or combinations thereof. The preferred fluid medium is aqueous, e.g., water and optionally one or more alcohols. When the colloidal particles are dispersed in an aqueous fluid, the particles can be stabilized due to common electrical charges that develop on the surface of each particle. The common electrical charges tend to promote dispersion rather than agglomeration or aggregation, because the similarly charged particles repel one another.

Inorganic silica sols in aqueous media are well known in the art and available commercially. Silica sols in water or water-alcohol solutions are available commercially under such trade names as LUDOX (manufactured by E.I. duPont de Nemours and Co., Inc., Wilmington, Del.), NYACOL (available from Nyacol Co., Ashland, Mass.) or NALCO (manufactured by Nalco Chemical Co., Oak Brook, Ill.). Some useful silica sols are NALCO 1115, 2326, 1050, 2327, and 2329 available as silica sols with mean particle sizes of 4 nanometers (nm) to 77 nm. Another useful silica sol is NALCO 1034a available as a silica sol with mean particle size of 20 nanometers. Another useful silica sol is NALCO 8699 available as a silica sol with mean particle size of 2~4 nanometers. Additional examples of suitable colloidal silicas are described in U.S. Pat. No. 5,126,394.

The sols used in the present invention generally can include counter cations, in order to counter the surface charge of the colloids. Depending upon pH and the kind of colloids being used, the surface charges on the colloids can be negative or positive. Thus, either cations or anions are used as counter ions. Examples of cations suitable for use as counter ions for negatively charged colloids include $Na^+$, $K^+$, $Li^+$, a quaternary ammonium cation such as $NR_4^+$, wherein each R can be any monovalent moiety, but is preferably H or lower alkyl, such as —$CH_3$, combinations of these, and the like.

A variety of methods are available for modifying the surfaces of nanoparticles, depending on the functionality of the surface. Of the suggested reaction below, it is understood that when working in aqueous media there is a strong preference for groups stable or metastable in water.

Various mixtures of different types of nanoparticles can be used if desired (even including "bare" or "naked", i.e., nonfunctionalized nanoparticles or nanoparticles functionalized with only hydrophilic groups). The nanoparticles used in the coating composition of the present invention include not only nonspherical nanoparticles but also spherical nanoparticles. In certain preferred embodiments, the weight ratio of the nonspherical nanoparticles to the spherical nanoparticles ranges from 95:5 to 5:95, more preferably, 80:20 to 20:80, most preferably, 70:30 to 30:70.

The nanoparticle concentration in coating compositions of the present invention, in total, is preferably at least 0.1 percent by weight (wt %), more preferably at least 0.2 wt %, even more preferably at least 0.5 wt %, even more preferably at least 1 wt %, even more preferably at least 2 wt %, even more preferably greater than 2 wt %, even more preferably at least 3 wt %, even more preferably at least 4 wt %, even more preferably at least 5 wt %, and even more preferably at least 10 wt %, based on the total weight of the coating composition. The nanoparticle concentration is preferably no greater than 45 wt %, more preferably no greater than 40 wt %, and even more preferably no greater than 10 wt %, based on the total weight of the coating composition. Above about 45 percent by weight the coating composition becomes difficult to apply in the desired thickness range and below about 0.1 percent by weight, excessive time periods may be required for the coating to dry after application to the substrate. The terms "composition" and "solution" as used herein include dispersions or suspensions of nanoparticles in a liquid medium. In certain preferred embodiments, the coating composition comprises at least 0.05 wt % nonspherical nanoparticles and no greater than 40 wt % nonspherical nanoparticles, based on the total weight of the coating composition. In certain preferred embodiments, the coating composition comprises at least 0.05 wt % spherical nanoparticles and no greater than 40 wt % spherical nanoparticles, based on the total weight of the coating composition.

Nonspherical Nanoparticles

The nonspherical nanoparticles (preferably, elongated colloidal silica particles) may have an average diameter of 5 to 60 nm, a length, $D_1$, of 40 to 500 nm (as measured by dynamic light-scattering method) and a degree of elongation $D_1/D_2$ of 5 to 30, wherein $D_2$ means a diameter in nm calculated by the equation $D_2=2720/S$ and S means specific surface area in $m^2/g$ of the particle, as is disclosed in the specification of U.S. Pat. No. 5,221,497. According to certain embodiments, nonspherical silica particles may have a diameter of 5~20 nm, a length of 50~200 nm.

U.S. Pat. No. 5,221,497 discloses a method for producing nonspherical silica nanoparticles by adding water-soluble calcium salt, magnesium salt or mixtures thereof to an aqueous colloidal solution of active silicic acid or acidic silica sol having a mean particle diameter of 3 to 30 nm in an amount of 0.15 to 1.00 wt. % based on CaO, MgO or both to silica, then adding an alkali metal hydroxide so that the molar ratio of $SiO_2/M_2O$ (M: alkali metal atom) becomes 20 to 300, and heating the obtained liquid at 60 to 300° C. for 0.5 to 40 hours. The colloidal silica particles obtained by this method are elongate-shaped silica particles that have elongations of a uniform thickness within the range of 5 to 40 nm extending in only one plane. The nonspherical silica sol may also be prepared as described by Watanabe et al. in U.S. Pat. No. 5,597,512. Briefly stated, the method comprises: (a) mixing an aqueous solution containing a water-soluble calcium salt or magnesium salt or a mixture of said calcium salt and said magnesium salt with an aqueous colloidal liquid of an active silicic acid containing from 1 to 6% (w/w) of $SiO_2$ and having a pH in the range of from 2 to 5 in an amount of 1500 to 8500 ppm as a weight ratio of CaO or MgO or a mixture of CaO and MgO to $SiO_2$ of the active silicic acid; (b) mixing an alkali metal hydroxide or a water-soluble organic base or a water-soluble silicate of said alkali metal hydroxide or said water-soluble organic base with the aqueous solution obtained in step (a) in a molar ratio of $SiO_2/M_2O$ of from 20 to 200, where $SiO_2$ represents the total silica content derived from the active silicic acid and the silica content of the silicate and M represents an alkali metal atom or organic base molecule; and (c) heating at least a part of the mixture obtained in step (b) to 60° C. or higher to obtain a heel solution, and preparing a feed solution by using another part of the mixture obtained in step (b) or a mixture prepared separately in accordance with step (b), and adding said feed solution to said heel solution while vaporizing water from the mixture during the adding step until the concentration of $SiO_2$ is from 6 to 30% (w/w). The silica sol produced in step (c) typically has a pH of from 8.5 to 11.

Useful nonspherical silica particles may be obtained as an aqueous suspension under the trade name SNOWTEX-OUP, SNOWTEX-UP, by Nissan Chemical Industries (Tokyo, Japan). The SNOWTEX-OUP consists of 15-16% (w/w) of nonspherical silica, less than 0.03% (w/w) of $Na_2O$, and water. The particles are 9 to 15 nanometers in diameter and have lengths of 40 to 300 nanometers. The suspension has a viscosity of less than 20 mPas at 25° C., a pH of 2 to 4, and a specific gravity of 1.10 at 20° C. The SNOWTEX-UP consists of 20-21% (w/w) of nonspherical silica, less than 0.35% (w/w) of $Na_2O$, and water. The particles are 9 to 15 nanometers in diameter and have lengths of 40 to 300 nanometers. The suspension has a viscosity of less than 100 mPas at 25° C., a pH of 9 to 10.5, and a specific gravity of 1.13 at 20° C.

Other useful nonspherical silica particles may be obtained as an aqueous suspension under the trade name SNOWTEX-PS-S and SNOWTEX-PS-M by Nissan Chemical Industries. SNOWTEX-PS-S has a morphology of a string of pearls comprised of nanoparticles. The mixture consists of 20-21% (w/w) of silica, less than 0.2% (w/w) of $Na_2O$, and water. The SNOWTEX-PS-M particles are 18 to 25 nanometers in diameter and have lengths of 80 to 150 nanometers. The particle size is 80 to 150 nanometers by dynamic light scattering methods. The suspension has a viscosity of less than 100 mPas at 25° C., a pH of 9 to 10.5, and a specific gravity of 1.13 at 20° C. The SNOWTEX-PS-S has a particle diameter of 10-15 nm and a length of 80-120 nm.

Spherical Nanoparticles

The term "spherical" is taken to include nominally spherical particles. The term "spherical nanometer-sized" refers to particles that are characterized by an average particle diameter (particle size) in the nanometer range, often no greater than 200 nanometers (nm), and preferably no greater than 60 nm (prior to surface modification, i.e., functionalization). More preferably, the average particle size is no greater than 45 nm (prior to surface modification), even more preferably no greater than 20 nm (prior to surface modification), even more preferably no greater than 10 nm (prior to surface modification), and even more preferably no greater than 5 nm (prior to surface modification). Preferably, prior to surface modification, the average particle size of the silica nanoparticles is at least 1 nm, more preferably at least 2 nm. A particularly preferred particle size is 2 nm to 5 nm.

Functionalized Nanoparticles

At least a portion of nonspherical nanoparticles or at least a portion of spherical nanoparticles used in coating compositions of the present invention include at least one group selected from the group consisting of epoxy group, amine group, hydroxyl, olefin, alkyne, (meth) acrylato, mercapto, or combinations thereof. If two or more kinds of functional groups are present, these functional groups may be on the same nanoparticle or on different nanoparticles. In one embodiment, only one of the functional groups is included in the nanoparticles.

The present invention involves the design of nanoparticle surface-chemistries that enable assembling/interconnecting the nanoparticles together through covalent chemical bonds (which can include a combination of organic-organic, organic-inorganic (e.g., C—N), or inorganic-inorganic bonds (e.g., Si—O—Si)), thereby forming a dendritic network. This network is believed to include a generally continuous phase of interbonded nanoparticles (which may be the same or different). Such structure contributes to the formation of coatings with improved properties relative to uncoated substrates.

Coatings resulting from nonspherical particles alone or spherical particles alone or the combination of functionalized nonspherical particles and functionalized spherical particles may not give the desired balance of mechanical durability, antireflective, and easy cleaning. Even if the combination of functionalized nonspherical particles and functionalized spherical particles can provide desired properties, the production cost of the coating composition will be abruptly increased as a result of excess functionalization, as compared with the present invention. Surprisingly, it was found that the combination of the functionalized nanoparticles in one shape and the non-functionalized nanoparticles in another shape can provide improved properties for the coating. For example, improved mechanical durability, anti-reflective, easy cleaning and control of porosity can be obtained by such a novel combination. As our assumption, the reasons may be explained as follows. For example, improved mechanical properties may be obtained by mixing the nonspherical particles with smaller functionalized spherical particles in certain ratios, which may help to achieve particle packing and coating topology which are important for mechanical durability. For example, when epoxy-functionalized nanoparticles having a diameter of 4 nm are mixed with non-functionalized nonspherical nanoparticles, improved durability can be obtained relative to mixtures of bared particles having the same weight ratio.

Epoxy Functional Groups

In some embodiments, a portion of the nanoparticles of the present invention are functionalized with organic groups, such as epoxy groups, which can be formed, for example, using epoxy alkoxysilane chemistry. The epoxy groups are covalently bonded to a preferred silica surface of individual nanoparticles, preferably through Si—O—Si bonds. Other nanoparticles containing zirconia, alumina, ceria, tin oxide, or titanium dioxide, may similarly be attached to epoxy alkoxysilanes by the chemical bonds Zr—O—Si, Al—O—Si, Ce—O—Si, Sn—O—Si, and Ti—O—Si, respectively. These chemical bonds may not be as strong as the siloxane bond, Si—O—Si, however, their bond strength is suitable for the present coating applications.

The level of coverage of the epoxy-functionalized nanoparticles herein is reported in terms of the concentration of epoxy groups in the coating composition, assuming 100% of the amount of epoxy groups in the coating composition would be covalently bonded to surfaces of the silica particles. Preferably, the epoxy groups are present on a particle surface in the coating composition in an amount equivalent to at least 3 mole-% of the total molar functional groups on said surface.

In some embodiments, the epoxy groups are present on a particle surface in the coating composition in an amount equivalent to at least 5 mole-%, even more preferably at least 10 mole-%, and even more preferably at least 25 mole-%, of total molar functional groups on the particle surface. Higher molar equivalents of epoxy groups can contribute to more bonds between particles, thereby forming a coating with a more dense particle network. In certain situations, an excess of epoxy groups (i.e., greater than 100%) can be desirable; however, typically the amount of epoxy groups on a particle surface in the coating composition is no more than 150 mole-% of the total molar functional groups on the particle surface. Due to the multifunctionality of the epoxy alkoxysilanes, when the coating composition includes more than 100 mole-% epoxy groups, more than a monolayer of the epoxysiloxane is created on the particle surface. An excess of hydrolyzed epoxy alkoxysilane, when present, can also function as a primer on the surface of the substrate.

The nanoparticle functionalization with epoxy groups can be accomplished using conventional techniques. For silica nanoparticles, however, it has been discovered that this can be advantageously accomplished by functionalizing the nanoparticles using epoxy functional compounds under acidic conditions. Preferably, the pH is no greater than 6, more preferably at a pH of no more than 5, even more preferably at a pH of no more than 3, and even more preferably at a pH of 1 to 3. Such pH is maintained for at least 3 hours, preferably at least 8 hours, and more preferably at least 12 hours. The desired pH and time of reaction are ones that enhance functionalization, enhance stability of the composition (e.g., reduce precipitation and/or agglomeration of the particles), and enhance antifogging characteristics of the resultant coating. For nanoparticles of 4-5 nm, the preferred pH range for the functionalization reaction is 1 to 3. After the functionalization reaction is carried out to the desired level (preferably, completed), the pH of the coating solution may be brought to a desired pH (e.g., to a range of 5 to 8).

The functional groups include various chemical groups that allow for binding to the nanoparticles. Such groups are typically provided by functional compound represented by the formula A-L-F1. The functional group F3 includes the epoxy groups. In this representation, the group A is the nanoparticle surface-bonding group, and L can be a bond or any of a variety of organic linkers. Organic linkers L can be linear or branched alkylene, arylene, or a combination of alkylene and arylene groups, optionally including heteroatoms.

Exemplary epoxy functional compounds include:

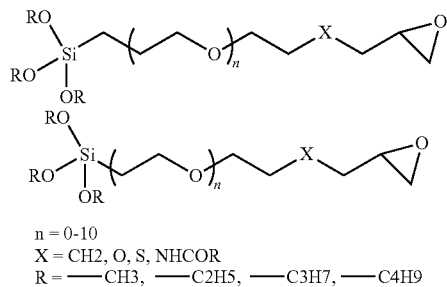

n = 0-10
X = CH2, O, S, NHCOR
R = ——CH3, ——C2H5, ——C3H7, ——C4H9

A variety of methods are available for modifying the surface of nanoparticles including, e.g., adding a surface modifying agent to nanoparticles (e.g., in the form of a powder or a colloidal dispersion) and allowing the surface modifying agent to react with the nanoparticles. For epoxy functional compounds A-L-F1, the surface-bonding groups A are typically silanols, alkoxysilanes, or chlorosilanes, which can be monofunctional, difunctional, or trifunctional. For example, the silanol groups on the surfaces of the silica nanoparticles are reacted with at least one silanol, alkoxysilane, or chlorosilane group of a functional compound to form a functionalized nanoparticle. Exemplary conditions for reacting functional compounds with silica nanoparticles are described in the Examples Section.

Amine Functional Groups

In certain embodiments, a portion of the nanoparticles of the present invention are functionalized with amine groups, which can be formed typically using aminosiloxane chemistry. The amine groups can be protected if desired. Combinations of protected amine groups and unprotected amine groups can be used if desired.

The amine groups are covalently bonded to a preferred silica surface of individual nanoparticles, preferably through Si—O—Si bonds. Other nanoparticles containing zirconia, alumina, ceria, tin oxide, or titanium dioxide, may similarly be attached to aminosiloxanes by the chemical bonds Zr—O—Si, Al—O—Si, Ce—O—Si, Sn—O—Si, and Ti—O—Si, respectively. These chemical bonds may not be as strong as the siloxane bond, Si—O—Si, however, their bond strength can be enough for the present coating applications.

The level of coverage of the amine-functionalized nanoparticles herein is reported in terms of the concentration of amine groups in the coating composition, assuming 100% of the amount of amine groups in the coating composition would be covalently bonded to surfaces of the silica particles. Preferably, the amine groups are present on a particle surface in the coating composition in an amount equivalent to at least 3 mole-% of the total molar functional groups on said surface.

More preferably, the amine groups are present on a particle surface in the coating composition in an amount equivalent to at least 5 mole-%, even more preferably at least 10 mole-%, and even more preferably at least 25 mole-%, of total molar functional groups on said surface. Higher molar equivalents of amine groups can contribute to more bonds between particles, thereby forming a coating with a more dense particle network. In certain situations, an excess of amine groups (i.e., greater than 100%) can be desirable; however, typically the amount of amine groups are present on a particle surface in the coating composition in an amount equivalent to no more than 150 mole-% of the total molar functional groups on said particle surface. Due to the multifunctionality of the amine alkoxysilanes, when the coating composition includes more than 100 mole-% amine groups, more than a monolayer of the aminosiloxane is created on the particle surface. An excess of hydrolyzed amine alkoxysilane, when present, can also function as a primer on the surface of the substrate.

The nanoparticle functionalization with amine groups can be accomplished using conventional techniques. For silica nanoparticles, however, it has been discovered that reacting amine alkoxysilanes to create amino functionality on the surface of the silica nanoparticles can be advantageously accomplished (for example, without gelling) using basic conditions. Preferably, this is accomplished at a pH of at least 10.5, even more preferably at a pH of at least 11.0, even more preferably at a pH of at least 11.5, even more preferably at a pH of at least 12.0, and even more preferably at a pH of at least 12.5. A typically upper pH is 14.0. In a typical method, the pH of an aqueous dispersion of silica nanoparticles is initially adjusted to this pH to generate negatively charged silica particles. Then the amine alkoxysilane is combined with the negatively charged silica nanoparticles and allowed to react for a time effective for the alkoxysilyl end of the amine alkoxysilane to preferentially react with the negatively charged silica surface. Such pH is maintained for a time effective to cause reaction between the alkoxysilyl end of the amine alkoxysilane and the silica nanoparticles. Typically, this is at least 2 hours, preferably at least 8 hours, and more preferably at least 12 hours. Temperatures above room temperature (e.g., 60° C.-80° C.) can be used to reduce the reaction time. The desired pH and time of reaction are ones that enhance functionalization and enhance stability of the composition (e.g., reduce precipitation and/or agglomeration of the particles). After the functionalization reaction is carried out to the desired level (preferably, completed), the pH of the coating solution may be brought to a desired pH (e.g., to a range of 5 to 8).

The functional groups include various chemical groups that allow for binding to the nanoparticles. Such groups are typically provided by functional compound represented by the formula A-L-F2. The functional group F1 includes the amine groups. In this representation, the group A is the nanoparticle surface-bonding group, and L can be a bond or any of a variety of organic linkers. Organic linkers L can be linear or branched alkylene, arylene, or a combination of alkylene and arylene groups, optionally including heteroatoms.

Exemplary amine functional compounds include:

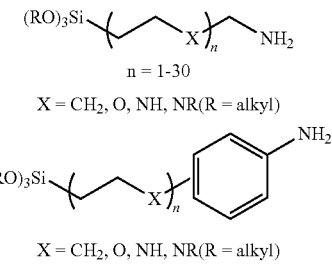

n = 1-30

X = $CH_2$, O, NH, NR(R = alkyl)

X = $CH_2$, O, NH, NR(R = alkyl)

A variety of methods are available for modifying the surface of nanoparticles including, e.g., adding a surface modifying agent to nanoparticles (e.g., in the form of a powder or a colloidal dispersion) and allowing the surface modifying agent to react with the nanoparticles. For amine functional compounds A-L-F2, the surface-bonding groups A are typically silanols, alkoxysilanes, or chlorosilanes, which can be monofunctional, difunctional, or trifunctional. For example, the silanol groups on the surfaces of the silica nanoparticles are reacted with at least one silanol, alkoxysilane, or chlorosilane group of a functional compound to form a functionalized nanoparticle. Exemplary conditions for reacting functional compounds with silica nanoparticles are described in the Examples Section. The surface-bonding groups in the described in invention may not be limited to silanols or alkoxy silanes. Ionic bonds or hydrogen bonds and other types of covalent bonds to nanoparticle surfaces may also be included.

The amine groups can be protected if desired. Typically, amine groups may be converted to a protected form by reaction with a suitable reagent that reacts with (i.e., protects) the amine and converts it to a form without hydrogen atoms bonded to the nitrogen atom. Subsequent deprotection regenerates the original amine group. Methods for protecting amine groups, and deprotecting the corresponding protected amine groups, are widely known and are described, for example, by P. J. Kocienski in "Protecting Groups", 3rd ed., Stuttgart: Thieme, 2004 and by T. W. Greene and P. G. M. Wuts in "Protective Groups in Organic Synthesis", 2nd ed., New York: Wiley-Interscience, 1991. Suitable protecting groups include $CH_3C(O)$—, $CF_3C(O)$—, $(CH_3)_3Si$—, $(CH_3)_2CH$—O—C(O)—, $CH_3$—O—C(O)—C(O)—, —C(O)OH, —C(O)O$^-$, alkyl-NH—C(O)—, wherein "—" represents a bond to the Nitrogen.

Olefin, Alkyne, (Meth) Acrylato, Mercapto Group

In certain preferred embodiments, a portion of the nanoparticles of the present invention are functionalized with at least one of selecting from the group consisting of olefin, alkyne, (meth) acrylato, and mercapto groups, which can be formed typically using olefin, alkyne, (meth) acrylato, mercapto siloxane chemistry.

The olefin, alkyne, (meth) acrylato, mercapto groups are covalently bonded to a preferred silica surface of individual nanoparticles, preferably through Si—O—Si bonds. Other nanoparticles containing zirconia, alumina, ceria, tin oxide, or titanium dioxide, may similarly be attached to olefin, alkyne, (meth) acrylato, mercapto siloxanes by the chemical bonds Zr—O—Si, Al—O—Si, Ce—O—Si, Sn—O—Si, and Ti—O—Si, respectively. These chemical bonds may not be as strong as the siloxane bond, Si—O—Si, however, their bond strength can be enough for the present coating applications.

The level of coverage of the olefin, alkyne, (meth) acrylato, mercapto functionalized nanoparticles herein is reported in terms of the concentration of unsaturated alkene, alkyne, acryl(metha) groups in the coating composition, assuming 100% of the amount of olefin, alkyne, (meth) acrylato, mercapto groups in the coating composition would be covalently bonded to surfaces of the silica particles. Preferably, the olefin, alkyne, (meth) acrylato, mercapto groups are present on a particle surface in the coating composition in an amount equivalent to at least 3 mole-% of the total molar functional groups on said surface.

More preferably, the olefin, alkyne, (meth) acrylato, mercapto groups are present on a particle surface in the coating composition in an amount equivalent to at least 5 mole-%, even more preferably at least 10 mole-%, and even more preferably at least 25 mole-%, of total molar functional groups on said surface. Higher molar equivalents of olefin, alkyne, (meth) acrylato, mercapto groups can contribute to more bonds between particles, thereby forming a coating with a more dense particle network. In certain situations, an excess of olefin, alkyne, (meth) acrylato, mercapto groups (i.e., greater than 100%) can be desirable; however, typically the amount of olefin, alkyne, (meth) acrylato, mercapto groups are present on a particle surface in the coating composition in an amount equivalent to no more than 150 mole-% of the total molar functional groups on said particle surface. Due to the multifunctionality of the olefin, alkyne, (meth) acrylato, mercapto alkoxysilanes, when the coating composition includes more than 100 mole-% olefin, alkyne, (meth) acrylato, mercapto groups, more than a monolayer of the olefin, alkyne, (meth) acrylato, mercapto siloxane is created on the particle surface. An excess of hydrolyzed olefin, alkyne, (meth) acrylato, mercapto alkoxysilane, when present, can also function as a primer on the surface of the substrate.

The nanoparticle functionalization with olefin, alkyne, (meth) acrylato, mercapto groups can be accomplished using conventional techniques. For silica nanoparticles, however, it has been discovered that reacting olefin, alkyne, (meth) acrylato, mercapto alkoxysilanes to create amino functionality on the surface of the silica nanoparticles can be advantageously accomplished (for example, without gelling) using basic conditions. Preferably, this is accomplished at a pH of at least 10.5, even more preferably at a pH of at least 11.0, even more preferably at a pH of at least 11.5, even more preferably at a pH of at least 12.0, and even more preferably at a pH of at least 12.5. A typically upper pH is 14.0. In a typical method, the pH of an aqueous dispersion of silica nanoparticles is initially adjusted to this pH to generate negatively charged silica particles. Then the alkene, alkyne, acryl(Metha) alkoxysilane are combined with the negatively charged silica nanoparticles and allowed to react for a time effective for the alkoxysilyl end of the alkene, alkyne, acryl(Metha) alkoxysilane to preferentially react with the negatively charged silica surface. Such pH is maintained for a time effective to cause reaction between the alkoxysilyl end of the olefin, alkyne, (meth) acrylato, mercapto alkoxysilane and the silica nanoparticles. Typically, this is at least 2 hours, preferably at least 8 hours, and more preferably at least 12 hours. Temperatures above room temperature (e.g., 60° C.-80° C.) can be used to reduce the reaction time. The desired pH and time of reaction are ones that enhance functionalization and enhance stability of the composition (e.g., reduce precipitation and/or agglomeration of the particles). After the functionalization reaction is carried out to the desired level (preferably, completed), the pH of the coating solution may be brought to a desired pH (e.g., to a range of 5 to 8).

The functional groups include various chemical groups that allow for binding to the nanoparticles. Such groups are typically provided by functional compound represented by the formula A-L-F3. The functional group F3 includes the olefin, alkyne, (meth) acrylato, mercapto groups. In this representation, the group A is the nanoparticle surface-bonding group, and L can be a bond or any of a variety of organic linkers. Organic linkers L can be linear or branched alkylene, arylene, or a combination of alkylene and arylene groups, optionally including heteroatoms.

Exemplary alkene, alkyne, acryl(metha) functional compounds are shown as follows in this order:

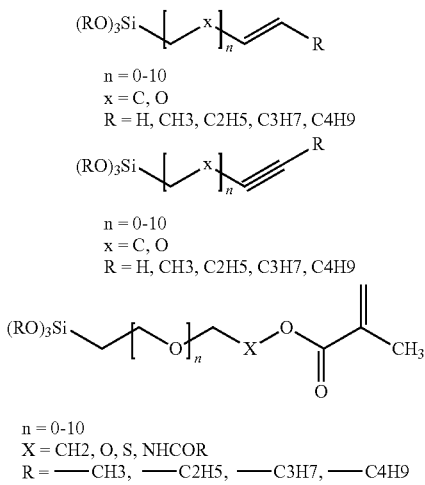

A variety of methods are available for modifying the surface of nanoparticles including, e.g., adding a surface modifying agent to nanoparticles (e.g., in the form of a powder or a colloidal dispersion) and allowing the surface modifying agent to react with the nanoparticles. For alkene, alkyne, acryl(metha) functional compounds A-L-F3, the surface-bonding groups A are typically silanols, alkoxysilanes, or chlorosilanes, which can be monofunctional, difunctional, or trifunctional. For example, the silanol groups on the surfaces of the silica nanoparticles are reacted with at least one silanol, alkoxysilane, or chlorosilane group of a functional compound to form a functionalized nanoparticle. Exemplary conditions for reacting functional compounds with silica nanoparticles are described in the Examples Section.

Optional Hydrophilic Groups

If desired, to enhance hydrophilicity of the functionalized nanoparticles of the present invention, additional hydrophilic (e.g., water-dispersible, water-soluble, and/or charged) groups can be covalently attached to individual particles. Hydrophilic groups (e.g., water-dispersible groups, water-soluble, and/or charged groups) are monovalent groups that are capable of providing hydrophilic characteristics to the nanoparticle surface, thereby reducing, and preferably preventing, excessive agglomeration and/or precipitation of the nanoparticles in an aqueous environment (although small amounts of agglomeration can be tolerated when the nanoparticles are in an aqueous environment as long as the average size of the agglomerates is preferably no greater than 80 nm).

As used herein, the term "hydrophilic compound" (e.g., "water-dispersible compound," "water-soluble" and/or charged) describes a compound that can react with a surface of the nanoparticles to modify it with hydrophilic groups (e.g., water-dispersible groups). It can be represented by the formula A-L-WD, wherein A are the surface-bonding groups, which may be the same or different as other surface-bonding groups described herein, WD represents the hydrophilic groups (e.g., water-dispersible groups, water-soluble groups, and/or charged groups), and L represents an organic linker or a bond. Organic linkers L can be linear or branched alkylene, arylene, or a combination of alkylene and arylene groups, optionally including heteroatoms.

The hydrophilic groups are water-like groups. They typically include, for example, anionic groups, cationic groups, groups that are capable of forming an anionic group or cationic group when dispersed in water (e.g., salts or acids), or mixtures thereof. The anionic or anion-forming groups can be any suitable groups that contribute to anionic ionization of the surface. For example, suitable groups include: carboxylate groups and structural units bearing multiple carboxylate groups, exemplified by bonded ethylenediamine triacetatic acid group and by bonded citric acid; sulfate half-ester groups and structural units bearing multiple sulfate half-ester groups; sulfonate groups and structural units bearing multiple sulfonate groups; phosphate mono- and/or diester groups and structural units bearing multiple phosphate mono and/or diester groups; phosphonate groups and structural units bearing multiple phosphonate groups; and similar groups, and acids thereof.

The cationic or cation-forming groups can be any suitable groups that contribute to cationic ionization of the surface. For example, suitable groups include quaternary ammonium groups, quaternary phosphonium groups, tertiary sulfonium groups, combinations thereof, and structural units bearing multiples thereof.

Other suitable hydrophilic groups include hydroxyl groups, polyethylene oxide groups, combinations thereof, and structural units bearing multiples thereof.

The hydrophilic groups may be neutral, but many are charged. "Charged groups" refer to groups that have one or more than one ionizable group per functional group.

In certain embodiments, preferred hydrophilic groups include carboxylic acid groups, sulfonic acid groups, phosphonic acid groups, or combinations thereof.

In certain embodiments, the attachment of water-dispersible groups on the surface of nanoparticles, significantly, means that dispersions thereof do not require external emulsifiers, such as surfactants, for stability. However, if desired anionic and cationic water-dispersible compounds can also be used in a composition that includes the functionalized nanoparticles to function as an external emulsifier and assist in the dispersion of the nanoparticles.

The hydrophilic groups can be provided using hydrophilic compounds of the formula A-L-WD. Suitable surface-bonding groups A of the hydrophilic compounds are described herein for the epoxy functional compounds, for example. Examples include silanols, alkoxysilanes, or chlorosilanes.

Some preferred hydrophilic compounds include the following:

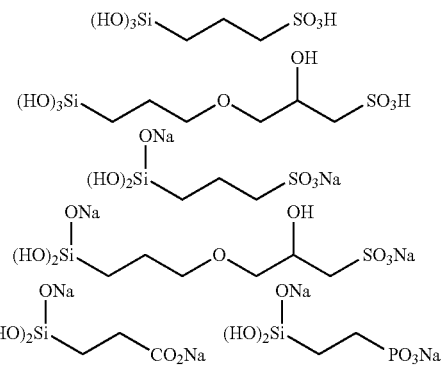

as well as other known compounds.

Those of ordinary skill in the art will recognize that a wide variety of other hydrophilic compounds are useful in the present invention as external emulsifiers or as compounds that can be used to modify the nanoparticles with water-dispersible groups.

Preferably, a sufficient amount of hydrophilic compound is reacted with the nanoparticles to provide the desired level of hydrophilicity without interfering with the antifogging, antireflective, and cleanable characteristics of the compositions of the present invention.

The level of coverage of the nanoparticles by hydrophilic groups herein is reported in terms of the concentration of hydrophilic groups in the coating composition, assuming 100% of the amount of hydrophilic groups in the coating composition would be covalently bonded to surface of the particles. If used, the hydrophilic groups are preferably present on a nanoparticle surface in the coating composition in an amount equivalent to at least 1 mole-%, and more preferably at least 10 mole-%, of the total molar functional groups on said surface. If used, the hydrophilic groups are preferably present on a nanoparticle surface in the coating composition in an amount equivalent to no more than 60 mole-%, more preferably no more than 50 mole-%, more preferably, no more than 20 mole-%, and even more preferably no more than 10 mole-%, of the total molar functional groups on said surface.

Preferably, the desired level of hydrophilicity is such that an external emulsifier is not necessary for preparing a storage-stable dispersion.

Optional Additives

In certain embodiments, the compositions of the present invention include one or more surfactants. The term "surfactant" as used herein describes molecules that reduce the surface tension of the coating composition and provide a coating which imparts desirable easy-cleaning, antireflective, and improved durability characteristics to substrates or articles coated therewith. Surfactants described in this invention may also be used as leveling agents for coating uniformity. Useful surfactants of the present invention include anionic, cationic, nonionic, or amphoteric surfactants. Examples include the following:

| Surfactant Type | Surfactant Name | Product Name | Source |
| --- | --- | --- | --- |
| Anionic | Sodium dodecyl benzene sulfonate | DS-10 | Rhone-Poulenc |

-continued

| Surfactant Type | Surfactant Name | Product Name | Source |
| --- | --- | --- | --- |
| Amphoteric | N-coco-aminopropionic acid | MIRATAINE AP-C | Rhone-Poulenc |
| Amphoteric | Cocaamidopropyl betaine | CAPB-30S | Shanghai Gaowei Chemical Co. |
| Nonionic | Lauryl dimethylamine oxide | RRODAMOX LO | Rhone-Poulenc |
| Nonionic | Alkyl polyglucoside | TRITON BG10 | Dow Chemical |
| Nonionic | PEG/PPG/PEG block copolymer | PLURONIC F38 | BASF Corp. |
| Nonionic | Organosilicone surfactant | BYK-333 | BYK |
| Nonionic | Organosilicone surfactant | Q2-5211 | Dow-Corning |
| Nonionic | Fluorochemical surfactant | FC-4430 | 3M |
| Nonionic | Fluorochemical surfactant | FC-4432 | 3M |
| Nonionic | Polyoxyethylene (7) lauryl ether | AEO7-24S | Sasol (China) Chemical Co., Ltd. |
| Nonionic | Polyoxyethylene (9) lauryl ether | AEO7-24S | Sasol (China) Chemical Co., Ltd. |
| Nonionic | Polyoxyethylene (18) lauryl ether | AEO7-24S | Sasol (China) Chemical Co., Ltd. |
| Cationic | Di-oleic acid triethanolamine esterquat | PRAEPAGEN 4317 | Clariant Chemicals (China) Ltd. |
| Cationic | Di-tallow dimethyl ammonium chloride | PRAEPAGEN 3345 | Clariant Chemicals (China) Ltd. |
| Cationic | Alkyldimethylbenzyl-ammonium chloride | DODIGEN 226 | Clariant Chemicals (China) Ltd. |
| Anionic Sulfosuccinate | Dioctyl ester of sodium sulfosuccinic acid | AEROSOL OT | Cytec Industries |
| Anionic Sulfosuccinates | Alkyl benzenesulfonic acid (C10-C16) | POLYSTEP A-13 | Stepan Company |
| Anionic Alkylbenzene sulfonates and sulfates | Sodium branched alkyl (C12) benzene sulfonate | POLYSTEP A-16 | Stepan Company |
| Anionic Alkylbenzene sulfonates and sulfates | Sodium dodecyl benzene sulfonate | RHODOCAL DS-10 | Rhone-Poulenc |
| Anionic Polyethoxylated derivatives of straight or branched chain aliphatic sulfate | Polyethoxylated alkyl (C12) ether sulfate, ammonium salt | STEOL CA-460 | Stepan Company |
| Anionic Straight or branched chain aliphatic sulfates and sulfonates | Aliphatic sulfates | HOSTASTAT HS-1 | Hoechst Celanese Corp. |
| Anionic Alkylbenzene sulfonates and sulfates | Sodium linear alkyl (C12) benzene sulfonate | POLYSTEP A-15 | Stepan Company |
| Anionic Alkyl carboxylate | Sodium stearate | | Witco |
| Amphoteric Alkyl carboxylates | N-coco-aminopropionic acid | MIRATAINE AP-C | Rhone-Poulenc |
| Anionic Alkyl phosphate mono- or di- ester | Ethoxylated dodecyl alcohol phosphate ester, sodium salt | RRODAFAC MC-470 | Rhone-Poulenc |
| Nonionic Polyethoxylated alkyl alcohol | Polyoxyethylene (23) lauryl ether | BRIJ 35 | ICI Americas Inc. |
| Nonionic Polyethoxylated alkyl alcohol | Plyoxyethylene (4) lauryl ether | BRIJ 30 | ICI Americas Inc. |
| Nonionic Polyethoxylated alkyl alcohol | Polyoxyethylene (7) lauryl ether | AEO7-24S | Sasol (China) Chemical Co., Ltd. |

| Surfactant Type | Surfactant Name | Product Name | Source |
| --- | --- | --- | --- |
| Nonionic Polyethoxylated alkyl alcohol | Polyoxyethylene (9) lauryl ether | AEO9-24S | Sasol (China) Chemical Co., Ltd. |
| Nonionic Polyethoxylated alkyl alcohol | Polyoxyethylene (18) lauryl ether | AEO18-24S | Sasol (China) Chemical Co., Ltd. |
| Nonionic Block copolymers of polyethylene oxide and polypropylene oxide | Block copolymer of ethylene oxide and propylene oxide | TETRONIC 1502 | BASF Corp. |
| Nonionic Block copolymers of polyethylene oxide and polypropylene oxide | PEG-PPG-PEG block copolymer | PLURONIC F38 | BASF Corp. |
| Nonionic Block copolymers of polyethylene oxide and polypropylene oxide | PEG-PPG-PEG block copolymer | TETRONIC 908 | BASF Corp. |
| Nonionic Amine oxide | Lauryl dimethylamine oxide | RHODAMOX LO | Rhone-Poulenc |
| Nonionic Polyethoxylated alkyl alcohol | Ethoxylated trimethylnonanol | TERGITOL TMN-6 | Union Carbide Chemical & Plastics Co., |

If used, the surfactant concentration in coating compositions of the present invention is preferably at least 0.01 percent by weight of the coating composition, more preferably at least 0.04 wt %, and even more preferably at least 0.1 wt %. If used, the surfactant concentration is preferably no greater than 10 wt % of the coating composition, more preferably no greater than 5 wt % of the coating composition.

Another optional but preferred additive is an antimicrobial agent. Examples include the following (with information with respect to solubility in water):

| Product Name | Composition | Company | Soluble in Water |
| --- | --- | --- | --- |
| KATHON CG | 5-Chloro-2-methyl-4-isothiazolin-3-one 2-Methyl-4-isothiazolin-3-one Magnesium chloride Magnesium nitrate Water | Rohm & Haas | Good |
| C302 | 1,3-Dimethylol-5,5-dimethylhydantoin | Shanghai JiuXin Chem. Co. Ltd. | Good |
| PROTECTOL PE/PES | 2-Phenoxyethanol | BASF | Dissolves in hot water |
| METHYL-SARABEN | Methyl-p-hydroxybenzoate | Taizhou Necchem Company (China) | Dissolves in hot water |
| PROPYL-SARABEN | Propyl-p-hydroxybenzoate | Taizhou Necchem Company (China) | Does not dissolve in hot water |
| DODIGEN 226 | Alkyldimethylbenzyl-ammonium chloride | Clariant Chemicals (China) Ltd. | Good |
| NIPACIDE BIT20 | Benzisothiazolinone | Clariant Chemicals (China) Ltd. | Good |

If used, the antimicrobial concentration in coating compositions of the present invention is preferably at least 0.0005 percent by weight (wt %) of the total weight of the coating composition, more preferably at least 0.001 wt %, and even more preferably at least 0.002 wt %. If used, the antimicrobial concentration is preferably no greater than 1 wt %, and more preferably no greater than 0.1 wt % of the total weight of the coating composition.

Typically, the coating compositions of the present invention include water as the liquid carrier (i.e., fluid media); however, organic solvents can be used in addition to the water. Suitable organic solvents in the present invention include methanol, ethanol, isopropanol, butanol, propylene glycol and its monomethyl ether, ethylene glycol and its monomethyl ether, ketones such as acetone and methyl ethyl ketone, and ethers such as tetrahydrofuran (THF), N,N-dimethylacetamide, formamide, or combinations thereof. If present, typically the organic solvent is an alcohol or combination of alcohols. The amount of organic solvent in the coating composition is typically no more than 30 wt %, preferably no more than 10 wt %, more preferably no more than 5 wt %, even more preferably no more than 2 wt %, and even more preferably no more than 1 wt %, based on the total weight of the liquid medium. The most preferred liquid medium is 100% water.

Articles

The coatings, when applied to a substrate (e.g., of inorganic and/or organic material) and dried, are removable or permanent. Substrates to which the coating compositions of the invention can be applied are preferably transparent or translucent to visible light. They include organic, inorganic materials, or combinations thereof. Exemplary substrates are made of polyester (e.g., polyethylene terephthalate (PET), polybutylene terephthalate), polycarbonate (PC), allyldiglycolcarbonate, polyacrylates such as polymethylmethacrylate, polystyrene, polysulfone, polyethersulfone, cellulose acetate butyrate, glass, polyolefin, PVC and the like, including blends and laminates thereof.

Typically the substrate is in the form of a film, sheet, panel or pane of material and is part of an article such as a solar panel, protective eye wear, face masks, face shields, surgical masks, and various other types of personal protection equipment, particularly for eyes, as well as mirrors, motor vehicle windows and windshields. The coatings may, if desired, cover only a portion of the article, e.g., only the section immediately adjacent the eyes in a face shield may be coated. The substrate may be flat, curved, or shaped. The article to be coated may be produced by any method such as by blowing, casting, extruding, or injection molding.

The compositions can be coated on a substrate as a fluid coating composition such as in the form of a liquid-based coating composition (e.g., in a pourable form or sprayable form) using conventional techniques, for example, such as bar, roll, curtain, rotogravure, spray, or dip coating techniques. Sprayers and nozzle systems suitable for use in this application are known to one skilled in the art and include, for example, hydraulic, pneumatic, rotary and ultrasonic nozzles and associated sprayer systems. An example of a hydraulic sprayer is the MSO sprayer available for US Global Resources (Seattle, Wash.). Examples of suitable pneumatic sprayers include the EGA Manual Touch-Up Gun available from DeVilbiss Corporation (Glendale Hts., Ill.) or the AJ-401-LH sprayer available from Jacto (Tualaltin, Oreg.). Rotary atomizers use a high speed rotating disk, cup or wheel to disperse the liquid into a hollow cone spray. The rotational speed controls the drop size. Examples of rotary atomizers include PROPTEC and PENGUIN atomizers available from Ledebuhr Industries (Williamston, Mich.). Ultrasonic atomizers use a high (20 kHz to 50 kHz) frequency vibration of a piezoelectric crystal to produce narrow drop size distribution and low velocity spray. Examples of suitable sprayers with ultrasonic atomizer nozzles include models VC5020AT and VC5040AT available from Sonics and Materials, Inc. (Newtown, Conn.).

Alternatively, the compositions of the present invention can be coated on a substrate by simply wiping a pad, cloth, paper towel, or other application device/material over the surface of the substrate, wherein the composition is contained within the pad, cloth, etc. or applied to the surface of the substrate surface. Suitable applicator substrates can be in the form of a sponge, foam, woven, nonwoven, or knit material, for example. The term "nonwoven web" or "nonwoven fabric" refers to a web or fabric having a structure of individual fibers that are interlaid in an irregular manner. In contrast, knit or woven fabrics have fibers that are interlaid in a regular manner. Materials of the applicator substrate (e.g., applicator pad or wipe) can include synthetic or natural fibers, filaments, or yarns. Suitable materials include, but are not limited to, polyolefins, polyesters, polyamides (e.g., nylons), polyurethanes, halogenated polyolefins, polyacrylates, polyureas, polyacrylonitriles, cellulose, cotton, rayon, jute, hemp, as well as copolymers and polymer blends thereof. Various combinations of materials in various shapes can be used for applicator substrates if desired. The most typical substrate is a paper wipe containing the coating composition (soaked or impregnated into the wipe).

The coatings of the present invention can be coated on one side or both sides of a substrate. The coatings of the present invention may be coated on one side of the substrate and the opposite side of the substrate may be uncoated or coated with a wide variety of conventional compositions, particularly conventional antifogging compositions. Preferably, the coating surface should face the direction of higher humidity, e.g., on a face shield the side having an antifog coating should face the wearer.

A coated surface may be dried at room temperature (e.g., over a 15 minute period) or if desired, at elevated temperatures, to dry more quickly (such as within 5 minutes). For coating compositions of the present invention, drying conditions can impact, for example, the durability, removability, and permanency of the dried coating. A "dried" coating (i.e., one in which the liquid carrier (i.e., fluid media) has been substantially completely removed, for example, by evaporation, from the coating composition) is typically also "cured" as a result of reaction between the reactive functional groups (e.g., amine groups and epoxy groups). Such curing can be enhanced by heating the coating composition during the drying process. For example, drying conditions can include a temperature of at least 80° C., or a temperature of at least 100° C., or at a temperature of at least 120° C. The substrate on which the coating composition is applied typically controls the temperature of drying. For example, for glass substrates, coatings can generally be dried at temperatures of 120° C. to 160° C. Generally, for plastic substrates, coatings can be dried at temperatures of 120° C. to 140° C., and more specifically, for PET substrates, coatings can be dried at temperatures of 120° C. to 135° C., and for PMMA substrates, coatings can be dried at temperatures of only up to 80° C.

Additionally, the coatings can be heated at temperatures and times typical of glass tempering (e.g., temperatures such as 700 to 750° C. for 2 to 5 minutes) do not destroy the properties important to solar cell coatings (high light transmittance, antireflection, anti-soiling, and anti-abrasion) even though Transmission Electron Microscopy (TEM) and ESCA do indicate some changes to the shape of the particles and the elemental composition of the coatings on the particles after the tempering process. However, the specific tempering conditions mentioned do not appear to sinter the particles. Tempering may be necessary for commercialized solar glass and thus the coating compositions may be applied before or after tempering. The relatively lower refractive index caused by the nanostructure imparts antireflection properties which can, at least in some embodiments, improve light transmittance by 2.0 to 3.0 percent and thus improves light to power conversion by 2.0 to 2.5 percent. Even under these high temperature tempering conditions, the resulting coatings can impart higher power conversion than naked silica particles.

The functional groups on the nanoparticles can contribute to adhesion of the coating to a substrate. For example, functional such as epoxy groups and/or amine groups can react with functionalities of a surface to form covalent bonds between the nanoparticles and the substrate. Alternatively or additionally, a substrate can be treated to improve adhesion between the substrate and the coating, using, e.g., chemical treatment, mechanical roughening, corona treatment such as air or nitrogen corona, plasma, flame, or actinic radiation. If desired, an optional tie layer can also be applied between the substrate and the coating to increase the interlayer adhesion.

An example of another article that can include a coating composition of the present invention includes a solar panel (e.g., a photovoltaic cell module) comprising: a photovoltaic cell or an array of photovoltaic cells (a series of interconnected photovoltaic cells); and a coating composition disposed on the front side of solar panel for transmission increase and for antisoiling and rinse-away cleaning.

In general, photovoltaic cells are semiconductor devices used to convert light into electricity and may be referred to as solar cells. Upon exposure to light, a photovoltaic cell generates a voltage across its terminals resulting in a consequent flow of electrons, the size of which is proportional to the intensity of the light impinging on the photovoltaic junction formed at the surface of the cell. Typically, a series of solar cell modules are interconnected to form a solar array (i.e., solar panel), which functions as a single electricity producing unit wherein the cells and modules are interconnected in such a way as to generate a suitable voltage in order to power a piece of equipment or supply a battery for storage, etc.

Semiconductor materials used in photovoltaic cells include crystalline or polycrystalline silicon or thin film silicon (e.g., amorphous, semicrystalline silicon) as well as non-silicon materials such as gallium arsenide, copper indium diselenide, organic semiconductors, CIGS, and the like. There are two types of photovoltaic cells, wafers and thin films. A wafer is a thin sheet of semiconductor material made by mechanically sawing it from a single crystal or multicrystal ingot or casting. Thin film based photovoltaic cells are continuous layers of semiconducting materials typically deposited on a substrate or substrate using sputtering or chemical vapour deposition processes or the like.

Wafer and thin film photovoltaic cells are often fragile enough such that a module may require one or more supports. The support may be rigid, e.g., a glass plate rigid material, or it may be a flexible material, e.g., a metallic film and/or sheet of suitable polymer material such as a polyimide or polyethylene terephthalate. The support may be a top layer or substrate, i.e., positioned between the photovoltaic cell and the light source, and which is transparent to light coming from the light source. Alternatively or in addition thereto, the support may be a bottom layer positioned behind the photovoltaic cell.

The coating composition of the present invention may be coated on the front side of a solar panel. The preferred coating thickness is in a range of 100 nm to 200 nm for antireflective coatings.

Exemplary Embodiments

1. A method of modifying a substrate surface, the method comprising:
a) applying a coating composition to a substrate, wherein the coating composition comprises:
    (i) nonspherical nanoparticles;
    (ii) spherical nanoparticles;
    (iii) optionally hydrophilic groups and optionally a surfactant; and
    (iv) a liquid medium comprising water and no greater than 30 wt % organic solvent, if present, based on the total weight of liquid medium,
    wherein at least a portion of the nonspherical nanoparticles or at least a portion of the spherical nanoparticles comprises functional groups attached to the surface of the nonspherical nanoparticles or the spherical nanoparticles through chemical bonds, and further wherein the functional groups comprise at least one group selected from epoxy group, amine group, hydroxyl, olefin, alkyne, (meth) acrylato, mercapto, or combinations thereof; and
(b) drying the coating composition to form a hydrophilic coating on the substrate.
2. The method of claim 1 wherein all the nonspherical nanoparticles or all the spherical nanoparticles comprise the functional groups.
3. The method of claim 1 wherein the weight ratio of the nonspherical nanoparticles to the spherical nanoparticles ranges from 95:5 to 5:95.
4. The method of claim 3 wherein the weight ratio of the nonspherical nanoparticles to the spherical nanoparticles ranges from 80:20 to 20:80.
5. The method of claim 4 wherein the weight ratio of the nonspherical nanoparticles to the spherical nanoparticles ranges from 70:30 to 30:70.
6. The method of claim 1 wherein at least a portion of the nonspherical nanoparticles comprise silica nanoparticles.
7. The method of claim 1 wherein at least a portion of the spherical nanoparticles comprise silica nanoparticles.
8. The method of claim 1 wherein the substrate is glass or ceramic.
9. The method of claim 1 wherein the method further comprises the step of sintering the coated substrate at a temperature ranging from 200 degrees C. to 750 degrees C.
10. The method of claim 1 wherein the nonspherical nanoparticles have an average particle size between 1 and 200 nm and an aspect ratio between 2 and 100.
11. The method of claim 1 wherein the spherical nanoparticles have an average particle size between 1 and 120 nm.
12. The method of claim 1 wherein the coating composition comprises at least 0.05 wt % nonspherical nanoparticles and no greater than 40 wt % nonspherical nanoparticles, based on the total weight of the coating composition.
13. The method of claim 1 wherein the coating composition comprises at least 0.05 wt % spherical nanoparticles and no greater than 40 wt % spherical nanoparticles, based on the total weight of the coating composition.
14. The method of claim 1 wherein the coating composition comprises 0.01-5 wt % surfactant, based on the total weight of the coating composition.
15. The method of claim 1 wherein the nonspherical nanoparticles are elongated nanoparticles.
16. The method of claim 1 wherein the spherical nanoparticles comprise the functional groups.
17. An article comprising a substrate surface modified using the method of claim 1.
18. A coating composition comprising
    nonspherical nanoparticles;
    spherical nanoparticles;
    optionally hydrophilic groups and optional an surfactant; and
    a liquid medium comprising water and no greater than 30 wt % organic solvent, if present, based on the total weight of liquid medium,
    wherein at least a portion of the nonspherical nanoparticles or at least a portion of the spherical nanoparticles comprises functional groups attached to their surface through chemical bonds, wherein the functional groups comprise at least one group selected from the group consisting of epoxy group, amine group, hydroxyl, olefin, alkyne, (meth) acrylato, mercapto group, or combinations thereof.
19. The composition of claim 18 wherein all the nonspherical nanoparticles or all the spherical nanoparticles comprise the functional groups.
20. The composition of claim 18 wherein the weight ratio of the nonspherical nanoparticles to the spherical nanoparticles ranges from 95:5 to 5:95.
21. The composition of claim 20 wherein the weight ratio of the nonspherical nanoparticles to the spherical nanoparticles ranges from 70:30 to 30:70.
22. The composition of claim 18 wherein at least a portion of the nonspherical nanoparticles comprise silica nanoparticles.
23. The composition of claim 18 wherein at least a portion of the spherical nanoparticles comprise silica nanoparticles.
24. The composition of claim 18 wherein the substrate is glass or ceramic.

25. The composition of claim 18 wherein the nonspherical nanoparticles have an average particle size between 1 and 200 nm and an aspect ratio between 2 and 100.

26. The composition of claim 18 wherein the spherical nanoparticles have an average particle size between 1 and 120 nm.

27. The composition of claim 18 wherein the coating composition comprises at least 0.05 wt % nonspherical nanoparticles and no greater than 40 wt % nonspherical nanoparticles, based on the total weight of the coating composition.

28. The composition of claim 18 wherein the coating composition comprises at least 0.05 wt % spherical nanoparticles and no greater than 40 wt % spherical nanoparticles, based on the total weight of the coating composition.

29. The composition of claim 18 wherein the coating composition comprises 0.01-5 wt % surfactant, based on the total weight of the coating composition.

30. The composition of claim 18 wherein a dried coating provides antireflective, easy cleaning and/or durability characteristics to the substrate for at least 24 hours.

31. The composition of claim 18 wherein the nonspherical nanoparticles are elongated nanoparticles.

32. The composition of claim 18 wherein the spherical nanoparticles comprise the functional groups.

33. An article comprising a substrate surface modified using the coating composition of claim 18.

34. The article of claim 33 which is a solar panel.

35. The article of claim 33 wherein the substrate is glass.

36. The article of claim 35 wherein the glass is tempered.

EXAMPLES

Unless otherwise indicated, all chemical reagents and solvents were or can be obtained from Aldrich Chemical Co., Milwaukee, Wis. All parts, percentages, or ratios specified in the examples are by weight, unless specified otherwise. All temperatures specified in the examples are in degrees Celsius, unless specified otherwise.

Spherical silica nanoparticles dispersions 1115 (4-nm), 2326 (5-nm), 8699 (2~4-nm), were obtained from Nalco Company, Naperville, Ill.

Nonspherical silica nanoparticles dispersions IPA-ST-UP, ST-OUP, ST-UP and ST-PS-S were obtained from Nissan Chemical Industries, LTD.

3-(glycidoxypropyl)-trimethoxysilane (KH560, 97%), aminoethylaminopropyltrimethoxysilane (Z-6020, 85%), and γ-methacryloxypropyltrimethoxysilane(Z-6030, 98%) were obtained from Zhejiang Chem-Tech Group Co., Ltd. Hangzhou, Zhejiang Province, China, or from Dow Corning Company, Midland, Mich.

Solar glass was obtained by CSG Holding Co. Ltd.

Antireflection Test

Total transmittance measurements were made on a HAZE-GARD DUAL haze and transmittance meter (BYK-Gardner, Columbia, Md., USA). The % transmission was directly read from the instrument as the average of the solar daylight wavelength range (CIE D65 standard illuminant) according to ASTM D1003.

The light transmission spectrum in 400~1200 nm was performed on Lambda 900, PerkinElmer.

Durability Test

The mechanical durability was evaluated by wet and dry scrubbing. The dry scrubbing was performed by rubbing (by hand, with strong pressure) the coated surface 100 times with a paper towel. The wet scrubbing was preformed on a Sheen Wet Abrasion Scrub Tester using 1 kg weight pressure with dishcloth and a 1.0% by weight detergent water solution (commercial dish detergent with anionic and nonionic surfactants from Shanghai Baimao Company) for 1000 cycles. (See table 2).

Easy Cleaning Test

This test was carried out by immersing the coated substrate sample into Gorecki Standard Carpet Soil available from Gorecki Manufacturing Inc., Milaca, Minn. and shaking it for 30 seconds. The sample was removed from the soil container and rinsed with tap water for 1 minute at a speed of 750 millimeters per minute (mL/min). The samples were rated based on their appearance. A rating of "good" was given if the sample was completely clean, and a rating of "bad" was given if the sample was not clean (see tables 3).

Hardness Test

The hardness was tested simply by personal nail and pencil by Test Method for film hardness coating (ASTM D 3363). If there is no scraping trace by scratching the coating with nail, we value the coating "pass", or else "fail". (See table 4)

85° C./85% RH test of IEC 61215

Coated glass samples were put in climatic chamber under 85%±5% RH and 85° C. after 1250 hours and the light transmission was tracked to determine the effect of damp heat aging durability. (See table 5)

Surface Modified Nanoparticle (SMN) 1 (Epoxy Functionalized—5-nm Spherical Nanoparticles):

Nalco 2326 silica nanoparticles (20 grams (g), 15 wt %) and deionized water (40 g) were stirred together in a glass jar for 15 minutes (min). Concentrated $H_3PO_4$ was dropped into the dispersion to adjust pH value to 1.5~2.0. 0.85 g 3-(glycidoxypropyl)-trimethoxysilane (KH560) was slowly added to the solution. Then the solution was heated to 60 C and kept reaction for 10 hours. Coating solution concentrations were about 5 wt % and were used in the preparation of coating samples for examples described in Tables 1.

Surface Modified Nanoparticle (SMN) 2 (Epoxy Functionalized—4 nm Spherical Nanoparticles):

Nalco 2326 silica nanoparticles (20 grams (g), 15 wt %) and deionized water (40 g) were stirred together in a glass jar for 15 minutes (min). Concentrated $H_2SO_4$ was dropped into the dispersion to adjust pH value to 1.5~2.0. 0.85 g 3-(glycidoxypropyl)-trimethoxysilane (KH560) was slowly added to the solution. Then the solution was heated to 60 C and kept reaction for 10 hours. Coating solution concentrations were about 5 wt % and were used in the preparation of coating samples for examples described in Tables 1.

Surface Modified Nanoparticle (SMN) 3 (Epoxy Functionalized—4 nm Spherical Nanoparticles):

Nalco 1115 silica nanoparticles (20 g, 15 wt %) and deionized water (40 g) were stirred together in a glass jar for 15 min. Concentrated $H_2SO_4$ was dropped into the dispersion to adjust pH value to 1.5~2.0. 1.06 g 3-(glycidoxypropyl)-trimethoxysilane (KH560) was slowly added to the solution. Then the solution was heated to 60 C and kept reaction for 10 hours. Coating solution concentrations were about 5 wt % and were used in the preparation of coating samples for examples described in Tables 1.

Surface Modified Nanoparticle (SMN) 4 (Epoxy Functionalized—40-100 nm Nonspherical Nanoparticles):

Nissan SNOWTEX-OUP nonspherical nanoparticles (20 g, 15 wt %) and deionized water (40 g) were stirred together in a glass jar for 15 min. Concentrated $H_3PO_4$ was dropped into the dispersion to adjust pH value to 1.5~2.0. 0.21 g 3-(glycidoxypropyl)-trimethoxysilane (KH560) was slowly added to the solution. Then the solution was heated to 60 C and kept reaction for 10 hours. Coating solution concentrations were about 5 wt % and were used in the preparation of coating samples for examples described in Tables 1.

Surface Modified Nanoparticle (SMN) 5 (Epoxy Functionalized—2-4 nm Silica Spherical Nanoparticles):

Nalco 8699 silica nanoparticles (20 g, 15 wt %) and deionized water (40 g) were stirred together in a glass jar for 15 min. Concentrated $H_3PO_4$ was dropped into the dispersion to adjust pH value to 1.5~2.0. 1.06 g 3-(glycidoxypropyl)-trimethoxysilane (KH560) was slowly added to the solution. Then the solution was heated to 60 C and kept reaction for 10 hours. Coating solution concentrations were about 5 wt % and were used in the preparation of coating samples for examples described in Tables 1.

Surface Modified Nanoparticle (SMN) 6 (Amine Functionalized—40-100 nm Nonspherical Nanoparticles)

Nissan SNOWTEX-UP (20 g, 20 wt %) nonspherical nanoparticles and deionized water (60 g) were stirred together in a glass jar for 15 min. The pH of this mixture was adjusted to about 12 using 0.1N sodium hydroxide. 0.06 g aminoethylaminopropyltrimethoxysilane (Z-6020) in ethanol (5 g) was added drop-wise with stirring over a period of 1 to 1.5 hrs and the resulting mixture was continuously stirred at 20° C. for an additional 14 hrs. The resulting solution (5 wt %) was used in the preparation of coating samples for examples described in Tables 1.

Surface Modified Nanoparticle (SMN) 7 (Amine Functionalized—2-4 nm Silica Spherical Nanoparticles)

Nalco 8699 silica nanoparticles (20 g, 15 wt %) and deionized water (40 g) were stirred together in a glass jar for 15 min. The pH of this mixture was adjusted to about 12 using 0.1N sodium hydroxide. 0.20 g aminoethylaminopropyltrimethoxysilane (Z-6020) in ethanol (5 g) was added drop-wise with stirring over a period of 1 to 1.5 hrs and the resulting mixture was continuously stirred at 20° C. for an additional 14 hrs. The resulting solution (5 wt %) was used in the preparation of coating samples for examples described in Tables 1.

Surface Modified Nanoparticle (SMN) 8 (Acrylate Functionalized—40-100 nm Nonspherical Nanoparticles)

Nissan SNOWTEX-OUP nonspherical nanoparticles (20 g, 15 wt %) and deionized water (40 g) were stirred together in a glass jar for 15 min. Concentrated $H_3PO_4$ was dropped into the dispersion to adjust pH value to 1.5~2.0. 0.5 g γ-methacryloxypropyltrimethoxysilane (Z6030) was slowly added to the solution. Then the solution was heated to 60 C and kept reaction for 10 hours. Coating solution concentrations were about 5 wt % and were used in the preparation of coating samples for examples described in Tables 1.

Bared Nanoparticle (BN) 1 (4 nm Silica Spherical Nanoparticle)

Nalco 1115 silica nanoparticles (20 g, 15 wt %) and deionized water (80 g) were stirred together in a glass jar for 15 min. Concentrated $H_2SO_4$ was dropped into the dispersion to adjust pH value to 1.5~2.0. Coating solution concentrations were about 3 wt % and were used in the preparation of coating samples for examples described in Tables 1.

Bared Nanoparticle (BN) 2 (5 nm Silica Spherical Nanoparticle)

Nalco 2326 silica nanoparticles (20 g, 15 wt %) and deionized water (80 g) were stirred together in a glass jar for 15 min. Concentrated $H_3PO_4$ was dropped into the dispersion to adjust pH value to 1.5~2.0. Coating solution concentrations were about 3 wt % and were used in the preparation of coating samples for examples described in Tables 1.

Bared Nanoparticle (BN) 3 (2-4 nm Silica Spherical Nanoparticle)

Nalco 8699 silica nanoparticles (20 g, 15 wt %) and deionized water (80 g) were stirred together in a glass jar for 15 min. Concentrated $H_3PO_4$ was dropped into the dispersion to adjust pH value to 1.5~2.0. Coating solution concentrations were about 3 wt % and were used in the preparation of coating samples for examples described in Tables 1.

Bared Nanoparticle (BN) 4 (40-100 nm nonspherical nanoparticles in IPA/H2O)

Nissan IPA-ST-UP nonspherical nanoparticles (20 g, 15 wt %) and deionized water (80 g) were stirred together in a glass jar for 15 min. Coating solution concentrations were about 3 wt % and were used in the preparation of coating samples for examples described in Tables 1.

Bared Nanoparticle (BN) 5 (Acidic 40-100 nm Nonspherical Nanoparticles)

Nissan SNOWTEX-OUP nonspherical nanoparticles (20 g, 15 wt %) and deionized water (80 g) were stirred together in a glass jar for 15 min. Coating solution concentrations were about 3 wt % and were used in the preparation of coating samples for examples described in Tables 1.

Bared Nanoparticle (BN) 6 (Alkaline 40-100 nm Nonspherical Nanoparticles)

Nissan SNOWTEX-UP (30 g, 20 wt %) nonspherical nanoparticles and deionized water (170 g) were stirred together in a glass jar for 15 min. Coating solution concentrations were about 3 wt % and were used in the preparation of coating samples for examples described in Tables 1.

| Example | 5:95 | 20:80 | 30:70 | 40:60 | 50:50 |
|---|---|---|---|---|---|
| 1 | | | SMN1:BN4 | | |
| 2 | | | SMN2:BN4 | | |
| 3 | SMN3:BN5 | | | | |
| 4 | BN1:SMN4 | | | | |
| 5 | BN3:SMN8 | | | | |
| 6 | BN3:BN5 | | | | |
| 7 | BN3:SMN4 | | | | |
| 8 | | | BN3:SMN4 | | |
| 9 | | | | BN3:SMN4 | |
| 10 | | SMN5:BN5 | | | |
| 11 | | | | SMN5:BN5 | |
| 12 | | | | | SMN5:BN5 |
| 13 | | BN3:SMN6 | | | |
| 14 | | | | BN3:SMN6 | |
| 15 | SM7:BN6 | | | | |
| 16 | | | | SM7:BN6 | |

-continued

| Example | 5:95 | 20:80 | 30:70 | 40:60 | 50:50 |
|---|---|---|---|---|---|
| 17 | BN3:SMN8 | | | | |
| 18 | | | BN3:SMN8 | | |
| 19 | | | | | BN3:SMN8 |
| 20 | | | SMN4:BN3 | | |
| 21 | SMN4:BN3 | | | | |
| 22 | SMN5:BN5 | | | | |
| 23 | | | SMN5:BN5 | | |
| 24 | | | BN5:SMN5 | | |
| 25 | BN5:SMN5 | | | | |
| 26 | BN3:SMN6 | | | | |
| 27 | | | BN3:SMN6 | | |
| 28 | | | SMN6:BN3 | | |
| 29 | SMN6:BN3 | | | | |
| 30 | SM7:BN6 | | | | |
| 31 | | | SM7:BN6 | | |
| 32 | | | BN6:SM7 | | |
| 33 | BN6:SM7 | | | | |
| 34 | SMN8:BN3 | | | | |
| 35 | | | SMN8:BN3 | | |

Examples 1 to 37

Coating solutions (3 wt %) were prepared by mixing appropriate amounts of SMN and BN solutions with water and surfactants to improve wetting as indicated in Table 1.

Example 1 was prepared by gradually adding 9.0 g SMN 1 to 35.0 g BN4. Then 6.0 g deionized water was added to dilute the solution by the addition of 0.75 g of a 10% solution of TRITON BG10.

Example 2 was prepared by gradually adding 9.0 g SMN 2 to 35.0 g BN4. Then 6.0 g deionized water was added to dilute the solution by the addition of 0.75 g of a 10% solution of TRITON BG10.

Example 3 was prepared by gradually adding 1.5 g SMN 3 to 45.0 g BN4. Then 3.5 g deionized water was added to dilute the solution by the addition of 0.75 g of a 10% solution of TRITON BG10.

Example 4 was prepared by gradually adding 2.5 g BN1 to 28.5 g SMN4. Then 19.0 g deionized water was added to dilute the solution by the addition of 0.75 g of a 10% solution of TRITON BG10.

Example 5 was prepared by gradually adding 2.5 g BN3 to 28.5 g SMN8. Then 19.0 g deionized water was added to dilute the solution by the addition of 0.75 g of a 10% solution of TRITON BG10.

Example 6 was prepared by gradually adding 2.5 g BN3 to 47.5 g BN 5. Then 0.75 g of a 10% solution of TRITON BG10 was added to the coating solution.

Example 7 was prepared by gradually adding 2.5 g BN3 3 to 28.5 g SMN 4. Then 19.0 g deionized water was added to dilute the solution by the addition of 0.75 g of a 10% solution of TRITON BG10.

Example 8 was prepared by gradually adding 15.0 g BN3 to 21.0 g SMN 6. Then 14.0 g deionized water was added to dilute the solution by the addition of 0.75 g of a 10% solution of TRITON BG10.

Example 9 was prepared by gradually adding 20.0 g BN3 to 18.0 g SMN 6. Then 12.0 g deionized water was added to dilute the solution by the addition of 0.75 g of a 10% solution of TRITON BG10.

Example 10 was prepared by gradually adding 6.0 g SMN5 to 40.0 g BN5. Then 4.0 g deionized water was added to dilute the solution by the addition of 0.75 g of a 10% solution of TRITON BG10.

Example 11 was prepared by gradually adding 12.0 g SMN5 to 30.0 g BN 5. Then 8.0 g deionized water was added to dilute the solution by the addition of 0.75 g of a 10% solution of TRITON BG10.

Example 12 was prepared by gradually adding 15.0 g SMN5 to 25.0 g BN 5. Then 10.0 g deionized water was added to dilute the solution by the addition of 0.75 g of a 10% solution of TRITON BG10.

Example 13 was prepared by gradually adding 10.0 g BN3 to 24.0 g SMN6. Then 16.0 g deionized water was added to dilute the solution by the addition of 0.75 g of a 10% solution of TRITON BG10.

Example 14 was prepared by gradually adding 20.0 g BN3 to 18.0 g SMN6. Then 12.0 g deionized water was added to dilute the solution by the addition of 0.75 g of a 10% solution of TRITON BG10.

Example 15 was prepared by gradually adding 6.0 g SMN7 to 40.0 g BN6. Then 4.0 g deionized water was added to dilute the solution by the addition of 0.75 g of a 10% solution of TRITON BG10.

Example 16 was prepared by gradually adding 12.0 g SMN7 to 30.0 g BN6. Then 8.0 g deionized water was added to dilute the solution by the addition of 0.75 g of a 10% solution of TRITON BG10.

Example 17 was prepared by gradually adding 5.0 g BN3 to 27.0 g SMN8. Then 18.0 g deionized water was added to dilute the solution by the addition of 0.75 g of a 10% solution of TRITON BG10.

Example 18 was prepared by gradually adding 15.0 g BN3 to 21.0 g SMN8. Then 14.0 g deionized water was added to dilute the solution by the addition of 0.75 g of a 10% solution of TRITON BG10.

Example 19 was prepared by gradually adding 25.0 g BN3 to 15.0 g SMN8. Then 10.0 g deionized water was added to dilute the solution by the addition of 0.75 g of a 10% solution of TRITON BG10.

Example 20 was prepared by gradually adding 15.0 g BN3 to 21.0 g SMN4. Then 14.0 g deionized water was added to dilute the solution by the addition of 0.75 g of a 10% solution of TRITON BG10.

Example 21 was prepared by gradually adding 47.5 g BN3 to 1.5 g SMN4. Then 1.0 g deionized water was added to dilute the solution by the addition of 0.75 g of a 10% solution of TRITON BG10.

Example 22 was prepared by gradually adding 2.5 g BN5 to 28.5 g SMN5. Then 19.0 g deionized water was added to dilute the solution by the addition of 0.75 g of a 10% solution of TRITON BG10.

Example 23 was prepared by gradually adding 15.0 g BN5 to 21.0 g SMN5. Then 14.0 g deionized water was added to dilute the solution by the addition of 0.75 g of a 10% solution of TRITON BG10.

Example 24 was prepared by gradually adding 35.0 g BN5 to 9.0 g SMN5. Then 6.0 g deionized water was added to dilute the solution by the addition of 0.75 g of a 10% solution of TRITON BG10.

Example 25 was prepared by gradually adding 47.5 g BN5 to 1.5 g SMN5. Then 1.0 g deionized water was added to dilute the solution by the addition of 0.75 g of a 10% solution of TRITON BG10.

Example 26 was prepared by gradually adding 2.5 g BN3 to 28.5 g SMN6. Then 19.0 g deionized water was added to dilute the solution by the addition of 0.75 g of a 10% solution of TRITON BG10.

Example 27 was prepared by gradually adding 15.0 g BN3 to 21.0 g SMN6. Then 14.0 g deionized water was added to dilute the solution by the addition of 0.75 g of a 10% solution of TRITON BG10.

Example 28 was prepared by gradually adding 35.0 g BN3 to 9.0 g SMN6. Then 6.0 g deionized water was added to dilute the solution by the addition of 0.75 g of a 10% solution of TRITON BG10.

Example 29 was prepared by gradually adding 47.5 g BN3 to 1.5 g SMN6. Then 1.0 g deionized water was added to dilute the solution by the addition of 0.75 g of a 10% solution of TRITON BG10.

Example 30 was prepared by gradually adding 47.5 g BN6 to 1.5 g SMN7. Then 1.0 g deionized water was added to dilute the solution by the addition of 0.75 g of a 10% solution of TRITON BG10.

Example 31 was prepared by gradually adding 35.0 g BN6 to 9.0 g SMN7. Then 6.0 g deionized water was added to dilute the solution by the addition of 0.75 g of a 10% solution of TRITON BG10.

Example 32 was prepared by gradually adding 15.0 g BN6 to 21.0 g SMN7. Then 14.0 g deionized water was added to dilute the solution by the addition of 0.75 g of a 10% solution of TRITON BG10.

Example 33 was prepared by gradually adding 2.5 g BN6 to 28.5 g SMN7. Then 19.0 g deionized water was added to dilute the solution by the addition of 0.75 g of a 10% solution of TRITON BG10.

Example 34 was prepared by gradually adding 47.5 g BN3 to 1.5 g SMN8. Then 1.0 g deionized water was added to dilute the solution by the addition of 0.75 g of a 10% solution of TRITON BG10.

Example 35 was prepared by gradually adding 35.0 g BN3 to 9.0 g SMN8. Then 6.0 g deionized water was added to dilute the solution by the addition of 0.75 g of a 10% solution of TRITON BG10.

Example 36 was prepared by adding 12.5 g BN6 into solution of example 19.

Example 37 was prepared by adding 5.0 g SMN7 into solution of example 27.

Coating solutions were coated on the smooth side of solar glass substrates (CSG Holding Co. Ltd) by using a dip coater to obtain a dry coating thickness of about 100~200 nm. The coated samples were then dried at 100° C. for 10 minutes. After that, the coated samples were tempered at 750° C. for 3 minutes. The % transmittance increased after coating and tempering was 2.0~3.5 vs the uncoated glass in the case of all the examples. Example 6 is prepared by bared nanoparticles, used here as a control example.

TABLE 2

| | Durability | | | |
| | Dry | | Wet | |
| Example | Increased T(%) - original | Increased T(%) - After 100 times | Increased T(%) - original | Increased T(%) - After 1000 times |
| --- | --- | --- | --- | --- |
| 1 | 2.2 | −0.2 | 2.6 | 0 |
| 2 | 2.3 | −0.2 | 2.4 | 0 |
| 3 | 2.3 | −0.1 | 2.3 | −0.1 |
| 4 | 2.0 | 0 | 2.2 | −0.1 |
| 5 | 2.9 | −0.5 | NT | NT |
| 6 | 3.1 | −1.0 | 2.4 | −0.7 |
| 7 | 2.8 | −0.3 | NT | NT |
| 8 | 2.5 | −0.2 | NT | NT |
| 9 | 2.6 | −0.1 | NT | NT |
| 10 | 2.5 | −0.2 | NT | NT |
| 11 | 2.6 | −0.2 | NT | NT |
| 12 | 2.4 | −0.1 | NT | NT |
| 13 | 3.2 | −0.2 | NT | NT |
| 14 | 2.6 | −0.2 | NT | NT |
| 15 | 2.8 | −0.4 | NT | NT |
| 16 | 2.6 | −0.4 | NT | NT |
| 17 | 2.8 | −0.4 | NT | NT |
| 18 | 2.5 | −0.3 | NT | NT |
| 19 | 2.2 | −0.3 | NT | NT |
| 20 | 2.5 | −0.2 | NT | NT |
| 21 | 2.2 | −0.3 | NT | NT |
| 22 | 2.8 | −0.3 | NT | NT |
| 23 | 2.6 | −0.2 | NT | NT |
| 24 | 2.5 | −0.2 | NT | NT |
| 25 | 2.3 | −0.4 | NT | NT |
| 26 | 2.9 | −0.4 | NT | NT |
| 27 | 2.7 | −0.3 | NT | NT |
| 28 | 2.5 | −0.2 | NT | NT |
| 29 | 2.4 | −0.3 | NT | NT |
| 30 | 2.8 | −0.4 | NT | NT |
| 31 | 2.6 | −0.2 | NT | NT |
| 32 | 2.5 | −0.2 | NT | NT |
| 33 | 2.3 | −0.3 | NT | NT |
| 34 | 2.4 | −0.4 | NT | NT |
| 35 | 2.6 | −0.3 | NT | NT |
| 36 | 2.7 | −0.3 | NT | NT |
| 37 | 2.8 | −0.2 | NT | NT |

TABLE 3

| Example | Cleanability |
| --- | --- |
| Blank glass | Bad |
| 1 | Good |
| 3 | Good |
| 6 | Good |
| 7 | Good |
| 10 | Good |
| 13 | Good |
| 15 | Good |
| 17 | Good |

TABLE 4

| Example | Hardness | Nail Scratch |
| --- | --- | --- |
| 1 | 3H | Pass |
| 2 | 3H | Pass |
| 4 | 2H~3H | Fail |
| 6 | 1H | Fail |
| 9 | 3H | Pass |
| 12 | 3H | Pass |
| 14 | 3H | Pass |

TABLE 4-continued

| Example | Hardness | Nail Scratch |
|---|---|---|
| 15 | 2H~3H | Fail |
| 19 | 3H | Pass |

TABLE 5

| Example | Increased T(%) - Original | Increased T(%) - After 1250 h |
|---|---|---|
| 1 | 2.2 | −0.3 |
| 4 | 2.0 | +0.2 |
| 6 | 2.4 | −0.9 |
| 9 | 2.5 | −0.1 |

The complete disclosures of the patents, patent documents, and publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

We claim:

1. A coated solar panel comprising a solar panel and a tempered coating on the solar panel, wherein the coating comprises:
   nonspherical nanoparticles;
   spherical nanoparticles;
   optionally hydrophilic groups and optionally a surfactant; and
   wherein at least a portion of the nonspherical nanoparticles or at least a portion of the spherical nanoparticles comprises functional groups attached to their surface through chemical bonds, wherein at least one of the functional groups is the reaction product of the reaction of a spherical nanoparticle with a functional compound selected from the group consisting of

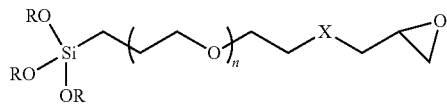

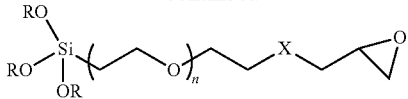

and combinations thereof,
wherein: n is an integer from 0 to 10;
X is CH2, O, S, or NHC(O)R; and
R is —CH3, —C2H5, —C3H7, and —C4H9;
wherein the coating has a score of 1H or greater in the pencil hardness test.

2. The coated solar panel of claim 1, wherein all the nonspherical nanoparticles or all the spherical nanoparticles comprise the functional groups.

3. The coated solar panel of claim 1, wherein the weight ratio of the nonspherical nanoparticles to the spherical nanoparticles ranges from 95:5 to 5:95.

4. The composition of claim 3, wherein the weight ratio of the nonspherical nanoparticles to the spherical nanoparticles ranges from 70:30 to 30:70.

5. The coated solar panel of claim 1, wherein at least a portion of the nonspherical nanoparticles comprise silica nanoparticles.

6. The coated solar panel of claim 1, wherein at least a portion of the spherical nanoparticles comprise silica nanoparticles.

7. The coated solar panel of claim 1, wherein the coating composition can be applied to a glass or ceramic substrate.

8. The coated solar panel of claim 1, wherein the nonspherical nanoparticles have an average particle size between 1 and 200 nm and an aspect ratio between 2 and 100.

9. The coated solar panel of claim 1, wherein the spherical nanoparticles have an average particle size between 1 and 120 nm.

10. The coated solar panel of claim 1, wherein the coating composition comprises at least 0.05 wt % nonspherical nanoparticles and no greater than 40 wt % nonspherical nanoparticles, based on the total weight of the coating composition.

11. The coated solar panel of claim 1, wherein the coating composition comprises at least 0.05 wt % spherical nanoparticles and no greater than 40 wt % spherical nanoparticles, based on the total weight of the coating composition.

12. The coated solar panel of claim 1, wherein the coating composition comprises 0.01-5 wt % surfactant, based on the total weight of the coating composition.

13. The coated solar panel of claim 1, wherein a dried coating provides antireflective, easy cleaning and/or durability characteristics to a substrate for at least 24 hours.

14. The coated solar panel of claim 1, wherein the nonspherical nanoparticles are elongated nanoparticles.

15. The coated solar panel of claim 1, wherein the spherical nanoparticles comprise the functional groups.

* * * * *

UNITED STATES PATENT AND TRADEMARK OFFICE
CERTIFICATE OF CORRECTION

PATENT NO. : 10,297,698 B2
APPLICATION NO. : 15/933412
DATED : May 21, 2019
INVENTOR(S) : Yiwen Chu et al.

It is certified that error appears in the above-identified patent and that said Letters Patent is hereby corrected as shown below:

On the Title Page

Item (57), Column 2, Abstract
Line 3, Delete "optional an" and insert -- an optional --, therefor.

In the Specification

Column 7
Line 41, Delete "gellation," and insert -- gelation, --, therefor.
Line 66, Delete "N,N-dimethyl acetamide," and insert -- N,N-dimethylacetamide, --, therefor.

Column 19
Line 5, Delete "Cocaamidopropyl" and insert -- Cocamidopropyl --, therefor.
Line 72, Delete "Plyoxyethylene" and insert -- Polyoxyethylene --, therefor.

Column 21
Line 47, Delete "2-Methy 1" and insert -- 2-Methyl --, therefor.
Line 52, Delete "C302" and insert -- C3O2 --, therefor.

Column 23
Line 23, Delete "(Tualaltin," and insert -- (Tualatin, --, therefor.

Column 25
Line 40, Delete "a)" and insert -- (a) --, therefor.

Column 26
Line 39, Delete "optional an" and insert -- an optional --, therefor.

Signed and Sealed this
Third Day of December, 2019

Andrei Iancu
*Director of the United States Patent and Trademark Office*

In the Claims

Column 36
Claim 4, Line 18, Delete "composition" and insert -- coated solar panel --, therefor.